United States Patent
Yoo et al.

(10) Patent No.: US 7,300,830 B2
(45) Date of Patent: Nov. 27, 2007

(54) METHOD OF FABRICATING LIQUID CRYSTAL DISPLAY PANEL

(75) Inventors: Soon Sung Yoo, Gunpo-shi (KR); Seung Hee Nam, Suwon-shi (KR)

(73) Assignee: LG. Philips LCD Co., Ltd., Seoul (KR)

( * ) Notice: Subject to any disclaimer, the term of this patent is extended or adjusted under 35 U.S.C. 154(b) by 257 days.

(21) Appl. No.: 10/963,856

(22) Filed: Oct. 13, 2004

(65) Prior Publication Data
US 2005/0130353 A1 Jun. 16, 2005

(30) Foreign Application Priority Data
Dec. 11, 2003 (KR) ............... 10-2003-0090304

(51) Int. Cl.
*H01L 21/00* (2006.01)
(52) U.S. Cl. ............ 438/151; 438/149; 438/150; 257/E51.005; 345/92
(58) Field of Classification Search ........ 438/149–151, 438/30, 159; 257/E51.005, E51.006, E29.273; 345/92; 349/42
See application file for complete search history.

(56) References Cited

U.S. PATENT DOCUMENTS

| | | | | |
|---|---|---|---|---|
| 5,811,325 A * | 9/1998 | Lin et al. | ............ | 438/159 |
| 6,461,968 B1 * | 10/2002 | Toyota et al. | ............ | 438/706 |
| 6,555,409 B2 * | 4/2003 | Kim et al. | ............ | 438/34 |
| 6,635,581 B2 * | 10/2003 | Wong | ............ | 438/736 |
| 6,664,149 B2 * | 12/2003 | Shih | ............ | 438/151 |
| 6,875,645 B2 * | 4/2005 | Lai | ............ | 438/151 |
| 6,882,394 B2 * | 4/2005 | Doi et al. | ............ | 349/133 |
| 6,888,585 B2 * | 5/2005 | Kim | ............ | 349/43 |
| 6,900,854 B1 * | 5/2005 | Kim et al. | ............ | 349/43 |
| 6,905,917 B2 * | 6/2005 | Song et al. | ............ | 438/149 |
| 7,071,045 B2 * | 7/2006 | Wu et al. | ............ | 438/197 |
| 2004/0106238 A1 * | 6/2004 | Lai | ............ | 438/151 |
| 2004/0131976 A1 * | 7/2004 | Hsu | ............ | 430/311 |
| 2004/0197966 A1 * | 10/2004 | Cho et al. | ............ | 438/151 |
| 2005/0087742 A1 * | 4/2005 | Chang et al. | ............ | 257/72 |
| 2005/0130353 A1 * | 6/2005 | Yoo et al. | ............ | 438/151 |

* cited by examiner

*Primary Examiner*—Thao X. Le
(74) *Attorney, Agent, or Firm*—Brinks Hofer Gilson and Lione

(57) ABSTRACT

A method of fabricating a liquid crystal display panel includes forming a first conductive layer on a substrate and patterning the first conductive layer using a first resist pattern printed on the first conductive layer to form a gate pattern. A semiconductor layer and a second conductive layer are stacked on a gate insulating film formed on the gate pattern. A second resist pattern having a stepped part printed on the second conductive layer forms a source/drain pattern of a transistor. A third resist pattern printed on a passivation film formed on the substrate patterns the film. A third conductive layer is formed on the patterned film and the third resist pattern and the third resist pattern is stripped to form a transparent electrode pattern including a pixel electrode connected to the drain electrode of the transistor.

4 Claims, 50 Drawing Sheets

METHOD OF FABRICATING LIQUID CRYSTAL DISPLAY PANEL

This application claims the benefit of Korean Patent Application No. P2003-90304 filed in Korea on Dec. 11, 2003, which is hereby incorporated by reference.

BACKGROUND

1. Field

The present invention relates to a liquid crystal display panel, and more particularly, to a method of fabricating a liquid crystal display panel capable of reducing a fabricating cost and simplifying a fabricating process.

2. Description of the Related Art

In general, a liquid crystal display device represents an image by means of adjusting a transmittance of a liquid crystal material using an electric field. For this purpose, the liquid crystal display device comprises a liquid crystal display panel in which the liquid crystal cells are arranged in a matrix pattern, and a driving circuit for driving the liquid crystal display panel.

The liquid crystal display panel includes a thin film transistor array substrate and a color filter array substrate facing each other, a spacer located for fixedly maintaining a cell gap between two substrates and a liquid crystal stuffed to the cell gap.

The thin film transistor array substrate includes gate lines and data lines, a thin film transistor formed as a switching device at every crossing of the gate lines and the data lines, a pixel electrode formed for every liquid crystal cell and connected to the thin film transistor, and an alignment film applied on them. The gate lines and the data lines receive signal from the driving circuits through each of the pad parts. The thin film transistor, in response to a scan signal supplied to a gate line, supplies to the pixel electrode a pixel voltage signal provided to the data line.

The color filter array substrate includes a color filter formed for every liquid crystal cell, a black matrix for reflecting external light and separating between the color filters, a common electrode commonly supplying a reference voltage to the liquid crystal cells, and the alignment film applied on them.

The liquid crystal display panel is fabricated by combining the thin film transistor array substrate and the color filter array substrate which are separately manufactured, injecting the liquid crystal material between the substrates and sealing the substrates having the liquid crystal material therebetween.

FIG. 1 is a plan view illustrating a part of a related art thin film transistor array substrate, and FIG. 2 is a sectional view illustrating the thin film transistor array substrate taken along line I-I' in FIG. 1.

The thin film transistor array substrate, shown in FIG. 1 and FIG. 2, includes gate lines 2 and data lines 4 crossing with each other and having a gate insulating film 44 therebetween on a lower substrate 42, a thin film transistor 6 formed at every crossing, and a pixel electrode 18 formed in the cell region arranged by the crossing fashion. Further, the thin film transistor array substrate includes a storage capacitor 20 formed at an overlapped part of the pixel electrode 18 and a pre-stage gate line 2, a gate pad part 26 connected to the gate line 2 and a data pad part 34 connected to the data line 4.

The thin film transistor 6 includes a gate electrode 8 connected to the gate line 2, a source electrode 10 connected to the data line 4, a drain electrode 12 connected to a pixel electrode 18, and an active layer 14 of a semiconductor pattern 68 which defines a channel between the source electrode 10 and the drain electrode 12 and overlaps the gate electrode 8. The active layer 14 overlaps a lower data pad electrode 36, a storage electrode 22, the data line 4, the source electrode 10 and the drain electrode 12, and further includes a channel portion defined between the source electrode 10 and the drain electrode 12. An ohmic contact layer 48 of the semiconductor pattern 68 for making an ohmic contact with the source electrode 10 and the drain electrode 12 are further formed on the active layer 14. The thin film transistor 6 responds to the gate signal supplied to the gate line 2 and makes a pixel voltage signal supplied to the data line 4 be charged to the pixel electrode 18.

The pixel electrode 18 is connected to the drain electrode 12 of the thin film transistor 6 via a first contact hole 16 passing through a passivation film 50. The pixel electrode 18 generates a potential difference along with the common electrode formed on the upper substrate (not shown) by a pixel voltage charged. By this potential difference, the liquid crystal material located between the thin film transistor substrate and the upper substrate rotates due to a dielectric anisotropy, and allows incident light through the pixel electrode 18 from the light source (not shown) to be transmitted to the upper substrate.

The storage capacitor 20 includes a pre-stage gate line 2, a storage electrode 22 overlapping the pre-stage gate line 2 having the gate insulating film 44, the active layer 14 and the ohmic contact layer 48 therebetween, and the pixel electrode 18 connected through a second contact hole 24 formed at the passivation film 50 and overlapped with the storage electrode 22 having the passivation film 50 therebetween. The storage capacitor 20 makes the pixel voltage be charged to the pixel electrode 18 stably maintain until a next pixel voltage is charged.

The gate line 2 is connected to a gate driver (not shown) through the gate pad part 26. The gate pad part 26 includes a lower gate pad electrode 28 extending from the gate line 2 and an upper gate pad electrode 32 connected to the lower gate pad electrode 28 via a third contact hole 30 passing through both of the gate insulating film 44 and the passivation film 50.

The data line 4 is connected to the data driver (not shown) through the data pad part 34. The data pad part 34 includes the lower data pad electrode 36 extending from the data line 4 and an upper data pad electrode 40 connected to the lower data pad electrode 36 via a fourth contact hole 38 passing through the passivation film 50.

FIGS. 3A to 3G are sectional views illustrating a method of fabricating a thin film transistor array substrate of a related art liquid crystal display panel.

First of all, a gate metal layer is formed by a deposition method such as a sputtering method on the lower substrate 42. Thereafter, as shown in FIG. 3A, a printing plate 99 is prepared, wherein the printing plate 99 includes a resist 98 that is printed in a groove 55 of a gate pattern shape representing a gate line, a gate electrode 8, and a lower gate pad electrode 28. Herein, the printing plate 99 may include an organic material such as acrylic or BCB (benzocyclobutene), and may be made by etching a glass substrate itself. A printing roller 88 is contacted with the printing plate 99 while rotating, thereby adhering or transferring the resist 98 to the printing roller 88, as shown in FIG. 3B.

The printing roller 88 having the resist 98 is rotated and contacted with the lower substrate 42 having the gate metal layer, thereby forming a resist pattern 98 of the gate pattern shape on the lower substrate 42. The gate metal layer is etched by using the resist pattern 98 as a mask, to thereby form the gate pattern including the gate line 2, the gate electrode 8, and the lower gate pad electrode 28, as shown in FIG. 3C. Herein, a metal for the gates includes chrome (Cr), molybdenum (Mo), aluminum (Al) and the like in a form of a single-layer structure or a double-layer structure.

A gate insulating film 44 is formed on the lower substrate 42 provided with the gate pattern. The gate insulating film 44 is made of an inorganic insulating material such as silicon oxide ($SiO_x$) or silicon nitride ($SiN_x$)

An amorphous silicon layer and a $n^+$ amorphous silicon layer are sequentially formed on the lower substrate 42 having the gate insulating film 44 thereon by a deposition technique such as plasma enhanced chemical vapor deposition (PECVD) and sputtering.

A resist pattern is formed on the $n^+$ amorphous silicon layer by using a printing roller and a printing plate, in which a resist is printed in a groove with a shape of a semiconductor pattern shape. Thereafter, the amorphous silicon layer and the $n^+$ amorphous silicon layer are patterned using the resist pattern as a mask. Accordingly, as shown in FIG. 3D, the semiconductor pattern 68 is formed. The semiconductor pattern 68 has a double-layer structure in which the active layer 14 and the ohmic contact layer 48 are stacked.

A source/drain metal layer is entirely formed on the lower substrate 42 provided with the semiconductor pattern 68 by a deposition technique such as plasma enhanced chemical vapor deposition (PECVD) and sputtering.

A resist pattern is formed on the source/drain metal layer by using a printing roller and a printing plate, in which a resist is printed in a groove with a shape of a source/drain pattern having a data line 4, a source electrode 10, a drain electrode 12, a storage electrode 22 and a lower data pad electrode 36. Thereafter, the source/drain metal layer is patterned using the resist pattern as a mask. Accordingly, there is formed the source/drain pattern including the data line 4, the source electrode 10, the drain electrode 12, the storage electrode 22 and the lower data pad electrode 36.

Next, the ohmic contact layer 48 of the channel portion is etched using the source electrode 10 and the drain electrode 12 as a mask, thereby etching the active layer 14 of the channel portion, as shown in FIG. 3E.

Herein, a metal for the source/drain pattern includes molybdenum (Mo), titanium (Ti), tantalum (Ta) or a molybdenum alloy.

A passivation film 50 is entirely formed on the lower substrate 42 having the source/drain pattern thereon by a deposition technique such as plasma enhanced chemical vapor deposition (PECVD). Thereafter, a resist pattern is formed on the lower substrate 42 provided with the passivation film 50 by using a printing roller and a printing plate having a groove with a printed resist. And then, the passivation film 50 is patterned through the use of the resist pattern as a mask, to thereby form first to fourth contact holes 16, 24, 30 and 38 as shown in FIG. 3F. The first contact hole 16 is formed in such a manner to pass through the passivation film 50 and exposes the drain electrode 12, whereas the second contact hole 24 is formed in such a manner to pass through the passivation film 50 and exposes the storage electrode 22. The third contact hole 30 is formed in such a manner to pass through the passivation film 50 and the gate insulating film 44 and exposes the lower gate pad electrode 28, whereas the fourth contact hole 38 is formed in such a manner to pass through the passivation film 50 and exposes the lower data pad electrode 36. Herein, the passivation film 50 is made of an inorganic insulating material such as silicon oxide ($SiO_x$) or silicon nitride ($SiN_x$).

A transparent electrode material is entirely deposited on the lower substrate 42 provided with the passivation film 50 by a deposition technique such as sputtering and the like. Then, a resist pattern is formed on the lower substrate 42 provided with the passivation film 50 by using a printing roller and a printing plate, in which a resist is printed in a groove with a shape of a transparent electrode pattern having a pixel electrode 18, an upper gate pad electrode and an upper data pad electrode. Thereafter, the transparent electrode material is patterned by using the resist pattern as a mask. Accordingly, the transparent electrode pattern including the pixel electrode 18, the upper gate pad electrode 32, and the upper data pad electrode 40 is formed. The pixel electrode 18 is electrically connected, via the first contact hole 16, to the drain electrode 12 while being electrically connected, via the second contact hole 24, to the storage electrode 22 overlapping a pre-stage gate line 2. The upper gate pad electrode 32 is electrically connected, via the third contact hole 30, to the lower gate pad electrode 28. The upper data pad electrode 40 is electrically connected, via the fourth contact hole 38, to the lower data pad electrode 36. In this connection, the transparent electrode material is made of indium-tin-oxide (ITO), tin-oxide (TO) or indium-zinc-oxide (IZO).

In such a method of manufacturing a related art thin film transistor array substrate, since the patterning process using the printing plate is performed over five times to manufacture thin film transistor array substrate, the manufacturing process is complicated, which is a major factor in increasing the manufacturing cost of the liquid crystal display panel. This is because one patterning process using the printing plate includes a lot of processes such as thin film deposition, cleaning, photolithography, etching, photo-resist stripping, inspection processes and the like. Accordingly, recently, the thin film transistor array substrate has been developed using a reduced number of mask processes. There is a need to simplify the manufacturing process and thus to save the manufacturing cost. Also, since a stripper used in a stripping process is very expensive and becomes wastewater after being used one time, the thin film transistor array substrate reducing the number of stripping processes is beneficial.

SUMMARY

By way of introduction only, in one embodiment of the invention, a method of fabricating a liquid crystal display panel includes: forming a first conductive layer on a substrate; forming a resist pattern printed on the first conductive layer; patterning the first conductive layer using the printed first resist pattern to form a gate pattern including a gate line and a gate electrode; forming a gate insulating film on the gate pattern; sequentially stacking a semiconductor layer and a second conductive layer on the gate insulating film; forming a second resist pattern having a stepped part printed on the second conductive layer a stepped part; patterning the semiconductor layer and the second conductive layer using the second resist pattern having the stepped part to form a source/drain pattern including a semiconductor pattern, a data line, a source electrode of a thin film transistor and a drain electrode of the thin film transistor; forming a passivation film on the substrate having the source/drain pattern; forming a third resist pattern printed on the passivation film; patterning the passivation film using the third resist pattern; forming a third conductive layer on the patterned passivation film and the third resist pattern; and removing the third resist pattern by a stripping process to form a transparent electrode pattern including a pixel electrode connected to the drain electrode of the thin film transistor.

Forming a second resist pattern having a stepped part printed on the second conductive layer includes: adhering a fourth resist pattern to a first roller by contacting a first printing plate with the first roller, wherein the first printing plate has the fourth resist pattern printed thereon; forming the fourth resist pattern on the second conductive layer by contacting the first roller having the fourth resist pattern adhered thereto onto the second conductive layer; adhering a fifth resist pattern to a second roller by contacting a second printing plate with the second roller, wherein the second printing plate has the fifth resist pattern printed thereon; and forming the fifth resist pattern on the fourth resist pattern by contacting the second roller having the fifth resist pattern adhered thereto onto the fourth resist pattern.

The fourth resist pattern is formed with a pattern identical to the source/drain pattern.

The fifth resist pattern is formed with a pattern identical to the source/drain pattern, aside from the source/drain pattern formed on an area overlapped with a channel area of the semiconductor pattern.

A method of fabricating a liquid crystal display panel according to another embodiment of the present invention includes: forming a first conductive layer and a second conductive layer on a first substrate; forming a first resist pattern printed on the first resist pattern; patterning the first and the second conductive layers using the first resist pattern to form a gate pattern including a gate line, a gate electrode, a gate pad and a data pad, all of which have the first conductive layer; forming a gate insulating film and a semiconductor layer on the first substrate provided with the gate pattern and the pixel electrode; forming a second resist pattern printed on the gate insulating film and the semiconductor pattern; patterning the gate insulating layer and the semiconductor layer using the second resist pattern to form a gate insulating pattern and a semiconductor pattern; forming a third conductive layer on the first substrate provided with the semiconductor pattern; forming a third resist pattern having a stepped part printed on the third conductive layer; patterning the third conductive layer using the third resist pattern to form a source/drain pattern of a thin film transistor including a data line, a source electrode and a drain electrode, and to expose the first conductive layer included in the gate pad and the pixel electrode; forming a passivation film on an entire surface of the first substrate in order to protect the thin film transistor; preparing a second substrate facing to the first substrate to be combined with the second substrate; and removing the passivation film of a pad area including the gate pad and the data pad using the second substrate as a mask to expose the gate pad and the data pad.

Forming a third resist pattern having a stepped part printed on the third conductive layer includes: adhering a fourth resist pattern to a first roller by contacting a first printing plate with the first roller, wherein the first printing plate has a fourth resist pattern printed thereon; forming the fourth resist pattern on the third conductive layer by contacting the first roller having the fourth resist pattern adhered thereon with the third conductive layer; adhering a fifth resist pattern to a second roller by contacting a second printing plate with the second roller, wherein the second printing plate has the fifth resist pattern printed thereon; and forming the fifth resist pattern on the fourth resist pattern by contacting the second roller having the fifth resist pattern adhered thereto onto the fourth resist pattern.

The fourth resist pattern is formed with a pattern identical to the source/drain pattern.

The fifth resist pattern is formed with a pattern identical to the source/drain pattern, aside from the source/drain pattern formed on an area overlapped with a channel area of the semiconductor pattern.

BRIEF DESCRIPTION OF THE DRAWINGS

The following detailed description of the embodiments of the present invention refers to the accompanying drawings, in which.

DETAILED DESCRIPTION

Reference will now be made in detail to the preferred embodiments of the present invention, examples of which are illustrated in the accompanying drawing.

Hereinafter, the embodiments of the present invention will be described in detail with reference to FIGS. 4 to 19.

Figure 1:
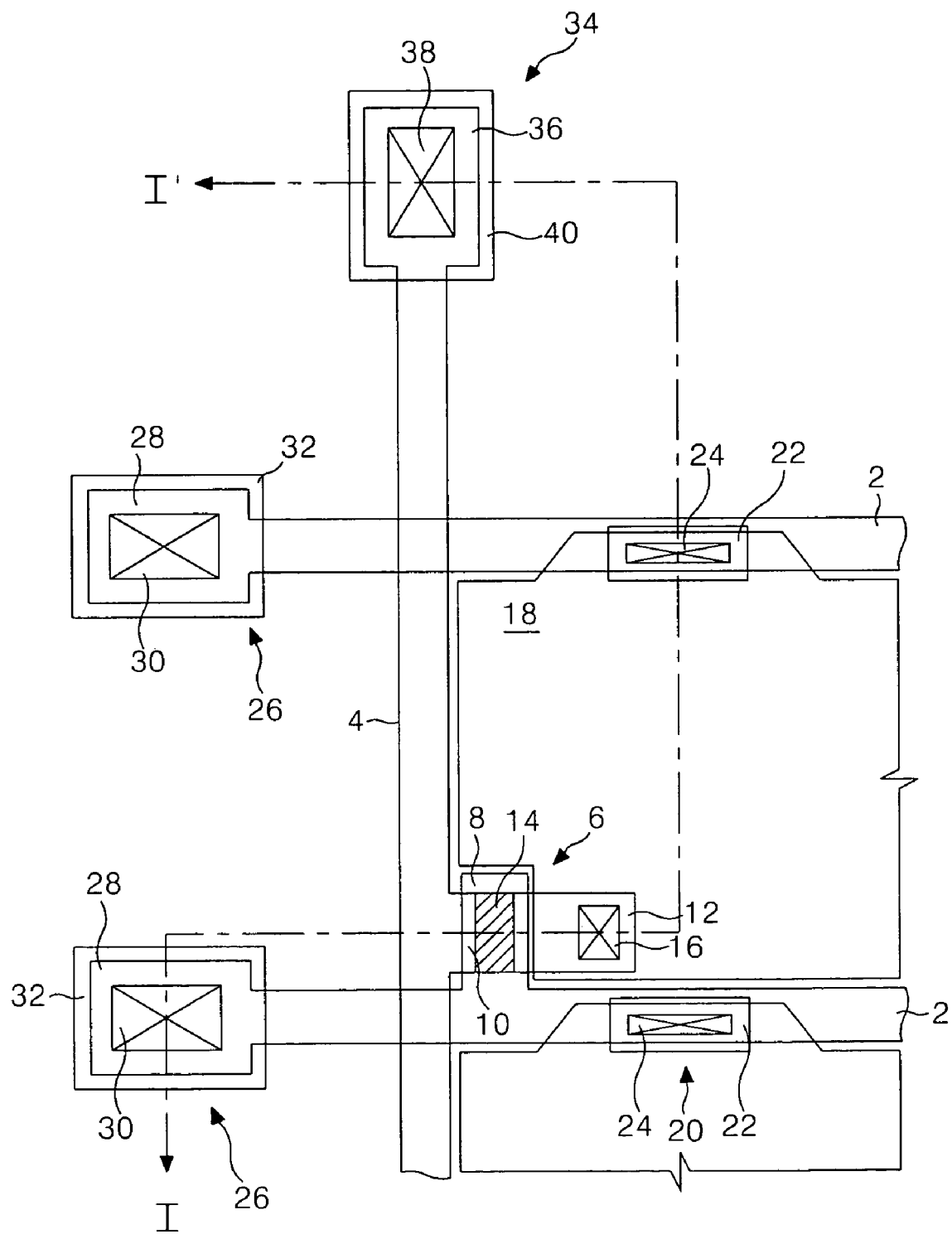
FIG. 1 is a plan view illustrating a related art thin film transistor array substrate.
Figure 2:
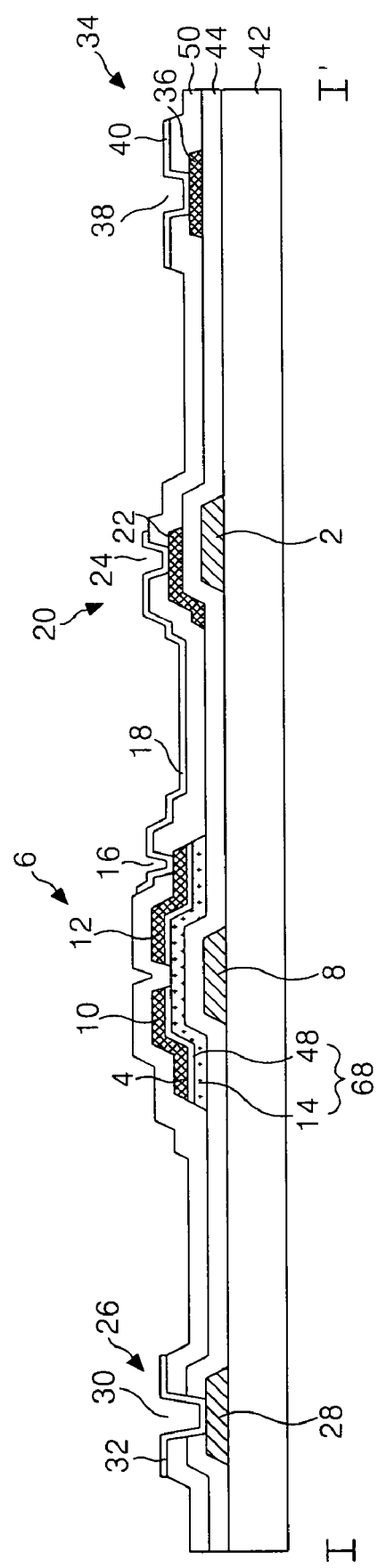
FIG. 2 is a sectional view illustrating the thin film transistor array substrate taken along the line I-I' in FIG. 1.
Figure 3A:
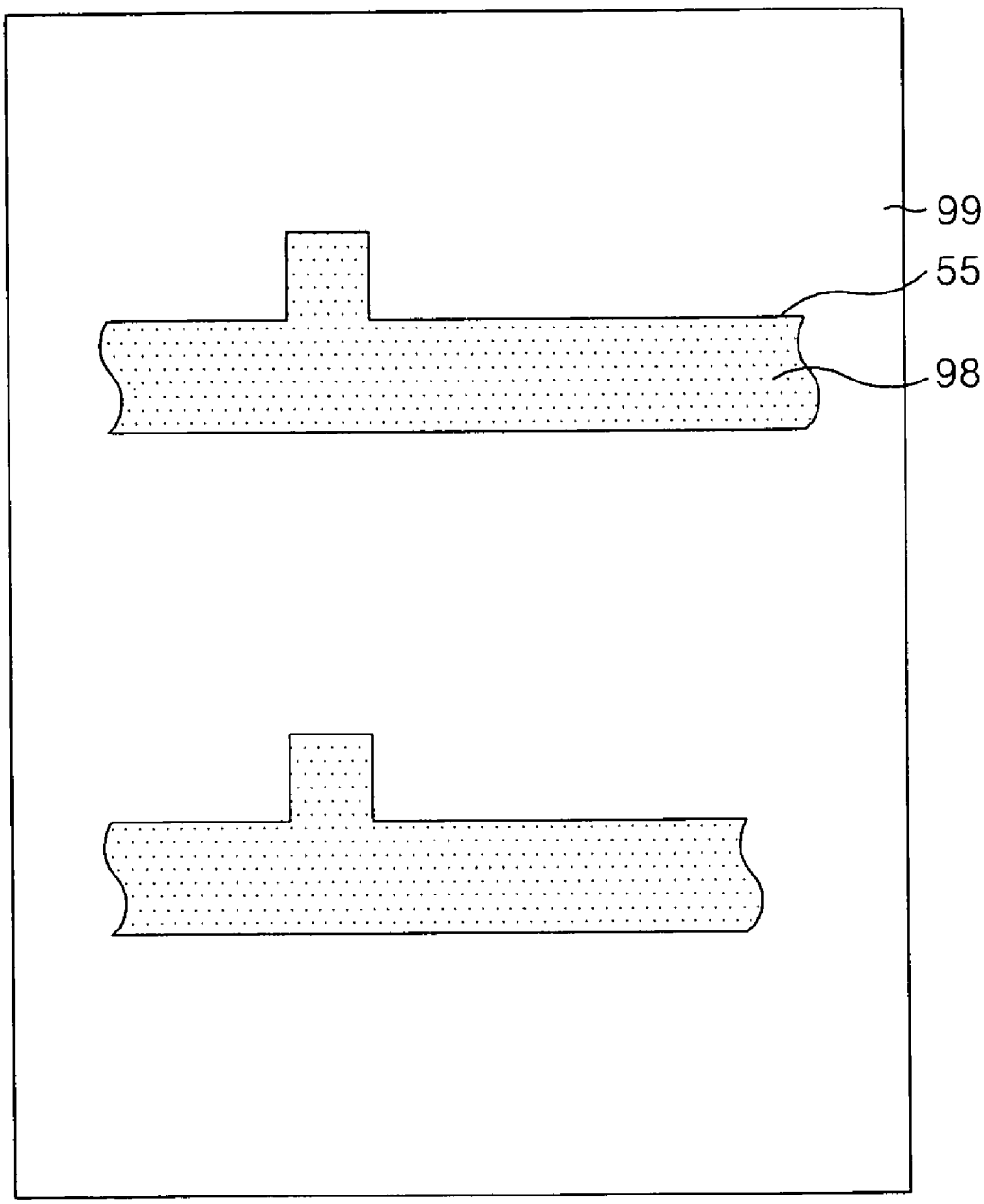
FIGS. 3A to 3G are configurations illustrating a method of fabricating the thin film transistor array substrate shown in FIG. 1.
Figure 3B:
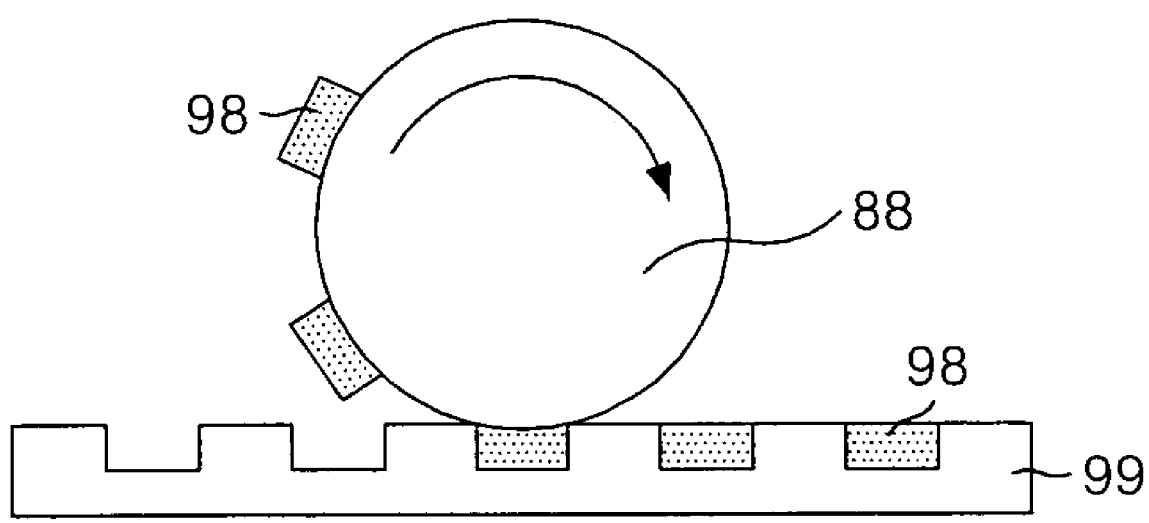
Figure 3C:
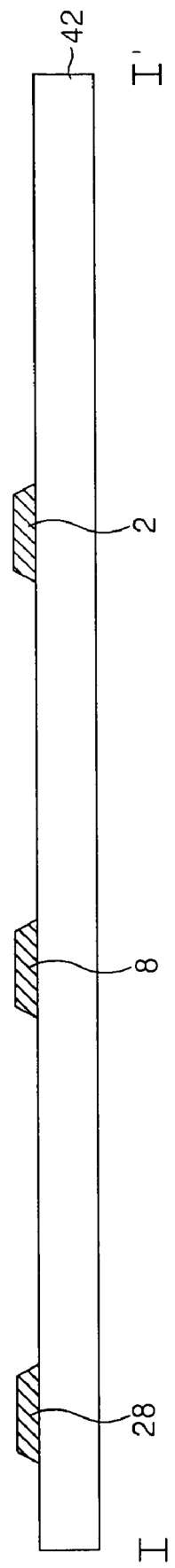
Figure 3D:
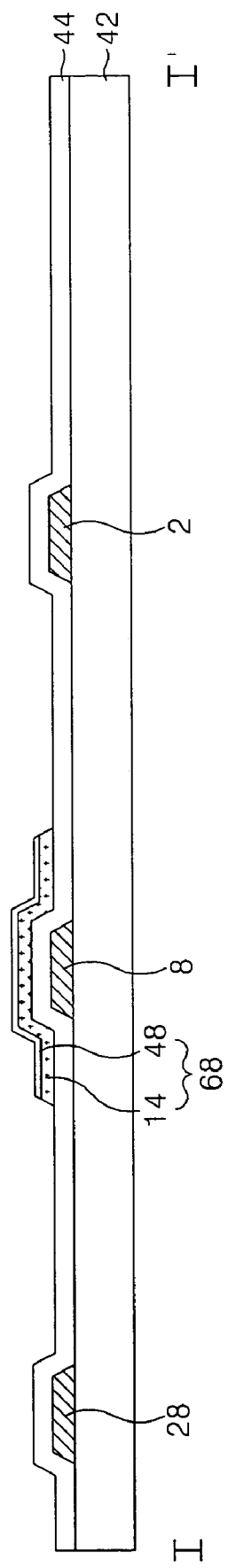
Figure 3E:
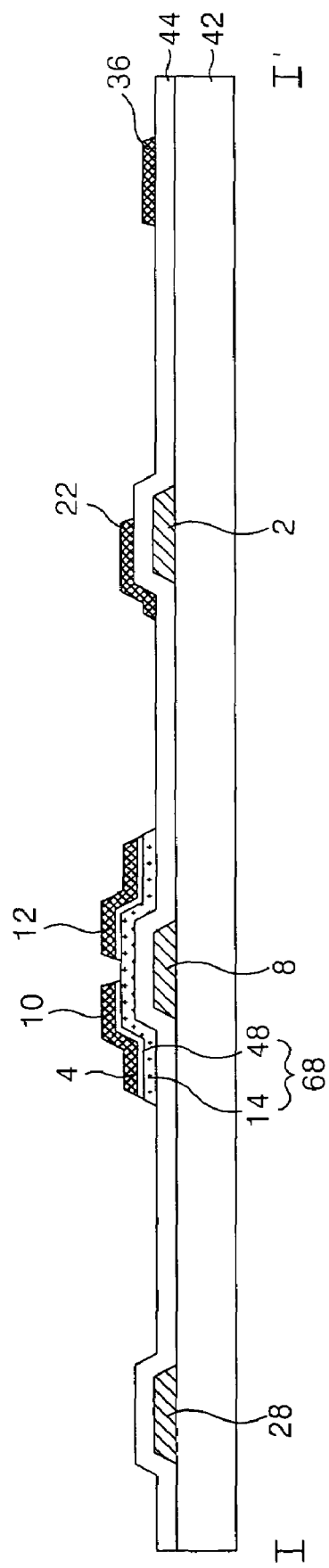
Figure 3F:
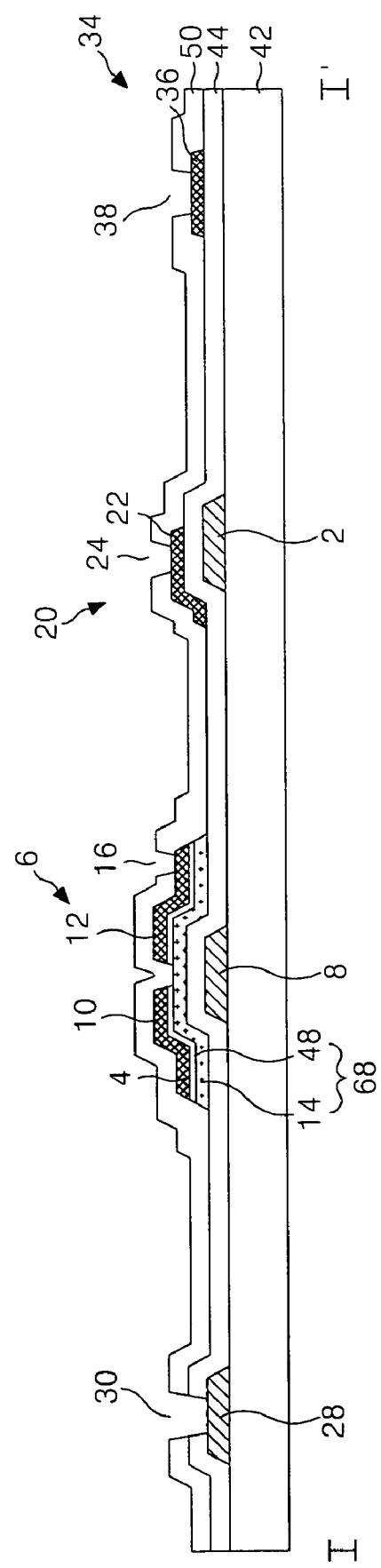
Figure 3G:
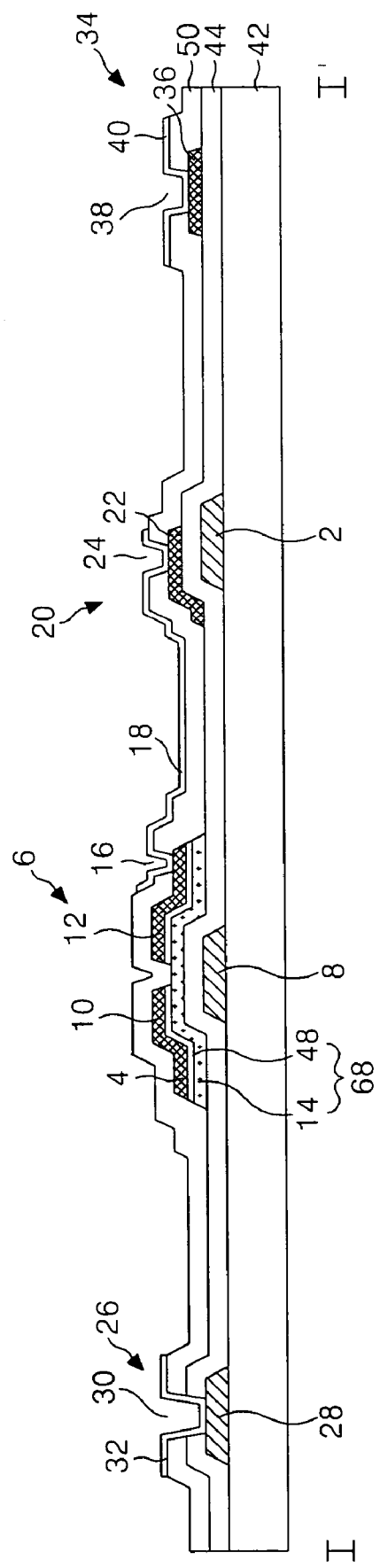
Figure 4:
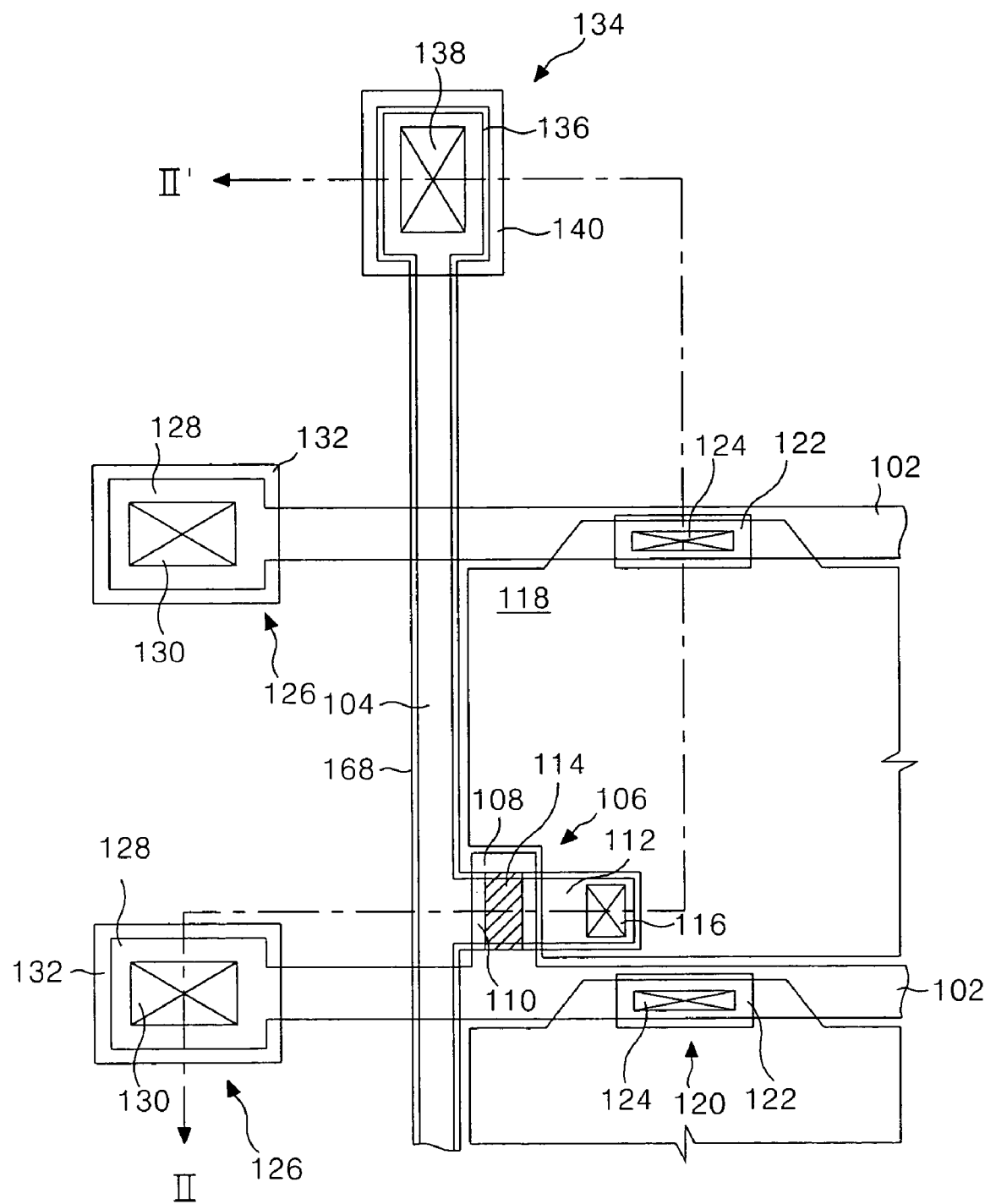
FIG. 4 is a plan view illustrating a thin film transistor array substrate according to a first embodiment of the present invention.
Figure 5:
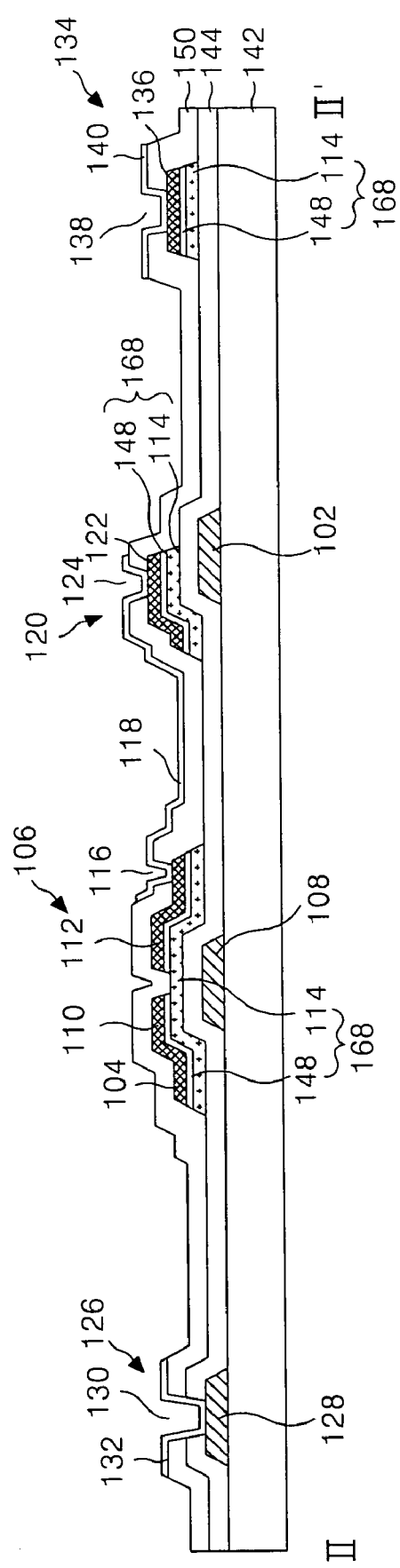
FIG. 5 is a sectional view of the thin film transistor array substrate taken along the line II-II' in FIG. 4.

FIG. 4 is a plan view illustrating a thin film transistor array substrate according to a first embodiment of the present invention, and FIG. 5 is a sectional view of the thin film transistor array substrate taken along the line II-II' in FIG. 4.

The thin film transistor array substrate, shown in FIG. 4 and FIG. 5, includes gate lines 102 and data lines 104 crossing with each other and having a gate insulating film 144 therebetween on a lower substrate 142, a thin film transistor 106 formed at every crossing, and a pixel electrode 118 formed in the cell region arranged by the crossing. Further, the thin film transistor array substrate includes a storage capacitor 120 formed at an overlapped part of the pixel electrode 118 and a pre-stage gate line 102, a gate pad part 126 connected to the gate line 102 and a data pad part 134 connected to the data line 104.

The thin film transistor 106 includes a gate electrode 108 connected to the gate line 102, a source electrode 110 connected to the data line 104, a drain electrode 112 connected to a pixel electrode 118, and an active layer 114 of semiconductor pattern 168 which overlaps the gate electrode 108 and defines a channel portion between the source electrode 110 and the drain electrode 112. The active layer 114 overlaps a lower data pad electrode 136, a storage electrode 122, the data line 104, the source electrode 110 and the drain electrode 112, and further includes the channel portion defined between the source electrode 110 and the drain electrode 112. An ohmic contact layer 148 of the semiconductor pattern 168 for making an ohmic contact with the lower data pad electrode 136, the storage electrode 122, the data line 104, the source electrode 10 and the drain electrode 12 are further formed on the active layer 114. The thin film transistor 106 responds to the gate signal supplied to the gate line 102 and makes a pixel voltage signal supplied to the data line 104 be charged to the pixel electrode 118.

The pixel electrode 118 is connected to the drain electrode 112 of the thin film transistor 106 via a first contact hole 116 passing through a passivation film 150. The pixel electrode 118 generates a potential difference along with the common electrode formed on the upper substrate (not shown) by a pixel voltage charged. By this potential difference, the liquid crystal material located between the thin film transistor substrate and the upper substrate rotates due to a dielectric anisotropy, and permits incident light through the pixel electrode 118 from the light source (not shown) to be transmitted to the upper substrate.

The storage capacitor 120 includes a pre-stage gate line 102, a storage electrode 122 overlapping the pre-stage gate line 102 having the gate insulating film 144, the active layer 114 and the ohmic contact layer 148 therebetween, and the pixel electrode 118 connected through a second contact hole 124 formed at the passivation film 150 and overlapped with the storage electrode 122 having the passivation film 150 therebetween. The storage capacitor 120 makes the pixel voltage charged to the pixel electrode 118 be stably maintained until a next pixel voltage is charged.

The gate line 102 is connected to a gate driver (not shown) through the gate pad part 126. The gate pad part 126 includes a lower gate pad electrode 128 extending from the gate line 102 and an upper gate pad electrode 132 connected to the lower gate pad electrode 128 via a third contact hole 130 passing through both of the gate insulating film 144 and the passivation film 150.

The data line 104 is connected to the data driver (not shown) through the data pad part 134. The data pad part 134 includes the lower data pad electrode 136 extending from the data line 104 and an upper data pad electrode 140 connected to the lower data pad electrode 136 via a fourth contact hole 138 passing through the passivation film 150.

FIGS. 6A to 7F are configurations illustrating a method of fabricating the thin film transistor array substrate shown in FIG. 5.

Figure 6A:
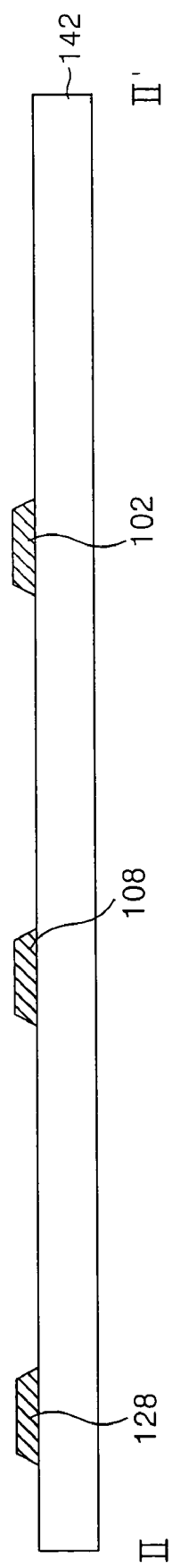
FIGS. 6A to 6D are configurations illustrating a method of fabricating the thin film transistor array substrate shown in FIG. 5.

A gate metal layer is formed by a deposition method such as a sputtering method on the lower substrate 142. Thereafter, a resist pattern is formed on the lower substrate 142 provided with the gate metal layer by using a printing roller and a printing plate in which a resist is printed in a groove with a shape of a gate pattern having the gate line 102, the gate electrode 108 and the lower gate pad electrode 128. The gate metal layer is etched by using the resist pattern as a mask, to thereby form the gate pattern including the gate line 102, the gate electrode 108, and the lower gate pad electrode 128, as shown in FIG. 6A. Herein, a gate metal, chrome (Cr), molybdenum (Mo), aluminum (Al) and the like are used in a form of a single-layer structure or a double-layer structure.

Figure 6B:
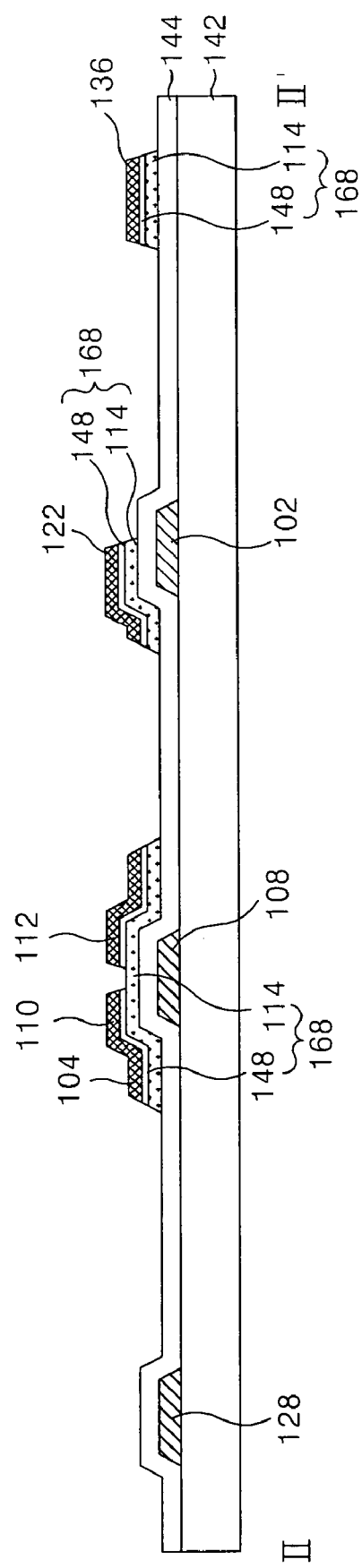

The gate insulating film 144, an amorphous silicon layer 114a and a n⁺ amorphous silicon layer 148a are sequentially formed on the lower substrate 142 having the gate pattern thereon by a deposition technique such as plasma enhanced chemical vapor deposition (PECVD) and sputtering. Subsequently, a source/drain metal layer 104a is formed. Thereafter, as shown in FIG. 6B, a semiconductor pattern 168 and a source/drain pattern are formed on the lower substrate 142 having the source/drain metal layer by using a printing plate, on which a resist is printed, and a printing roller.

A process of the semiconductor pattern 168 and the source/drain pattern will be described with reference to FIGS. 7A to 7F.

Figure 7A:
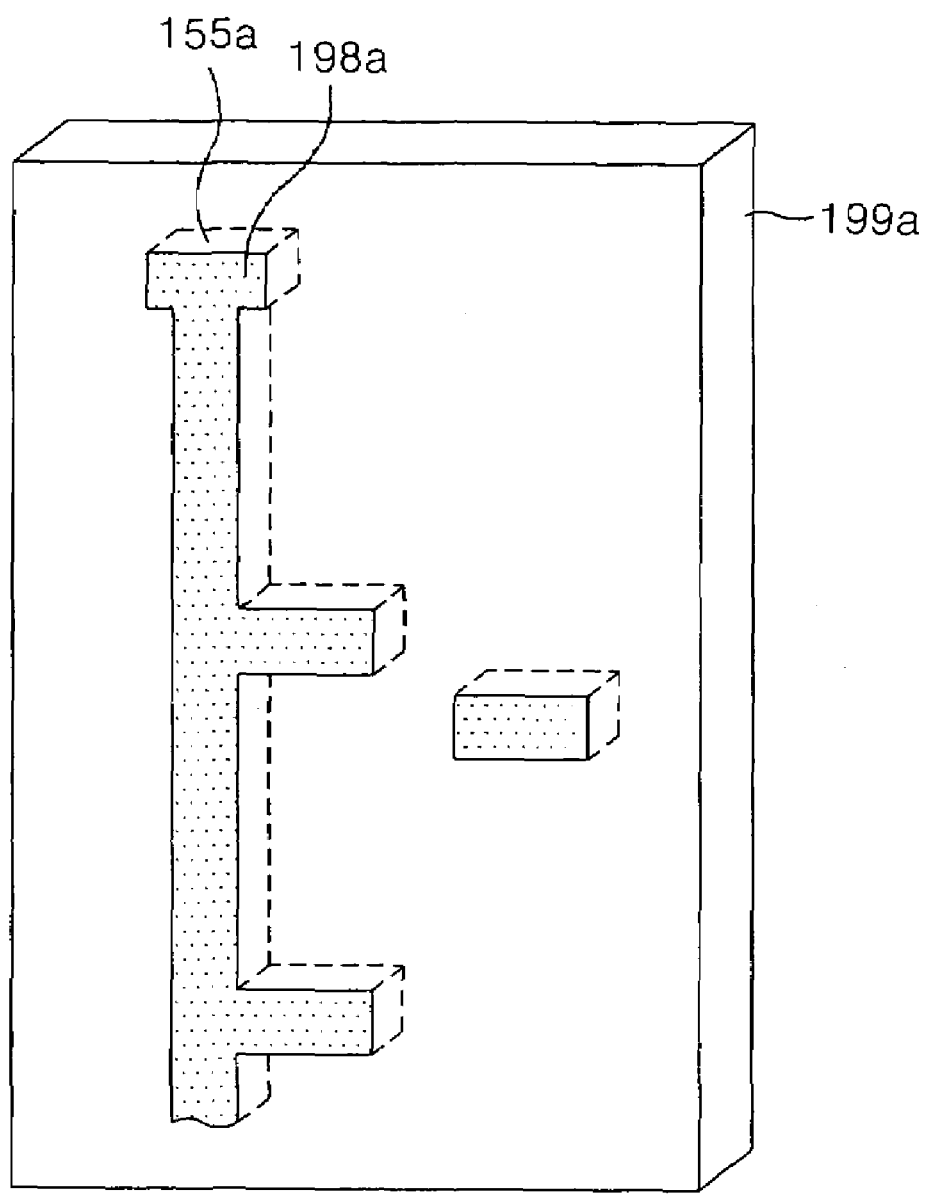
FIGS. 7A to 7F are configurations showing a formation of a stepped photo-resist pattern using a printing plate and a printing roller.
Figure 7B:
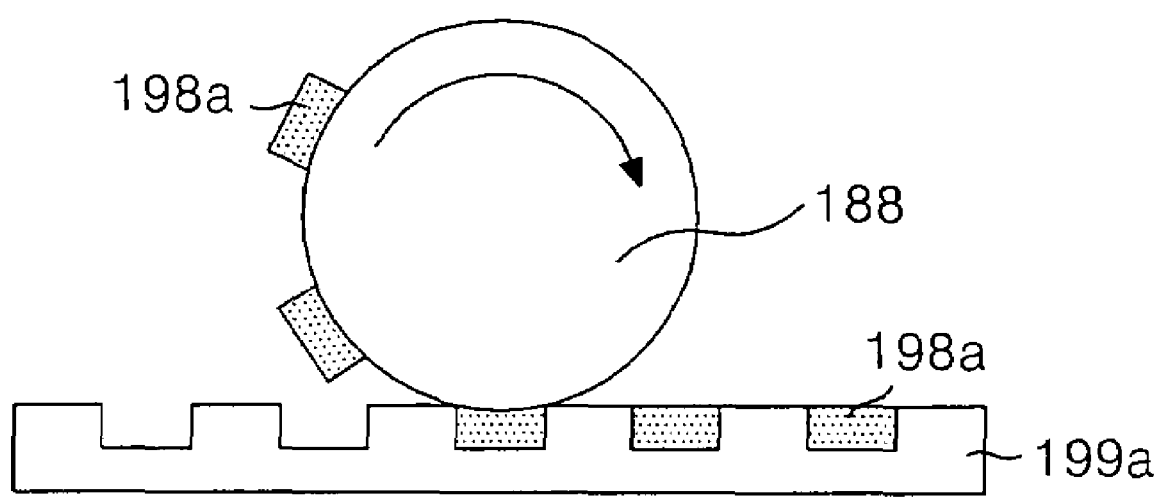

First of all, as shown in FIG. 7A, a first printing plate 199a is prepared, in which a first resist 198a is printed in a groove 155a with a shape of the source/drain pattern having the source electrode 110, the drain electrode 112, the storage electrode 122 and the lower data pad electrode 136. A printing roller 188 is contacted with the first printing plate 199a and, at the same time, is rotated, thereby adhering or transferring the first resist 198a to the printing roller 188, as shown in FIG. 7B.

Figure 7C:
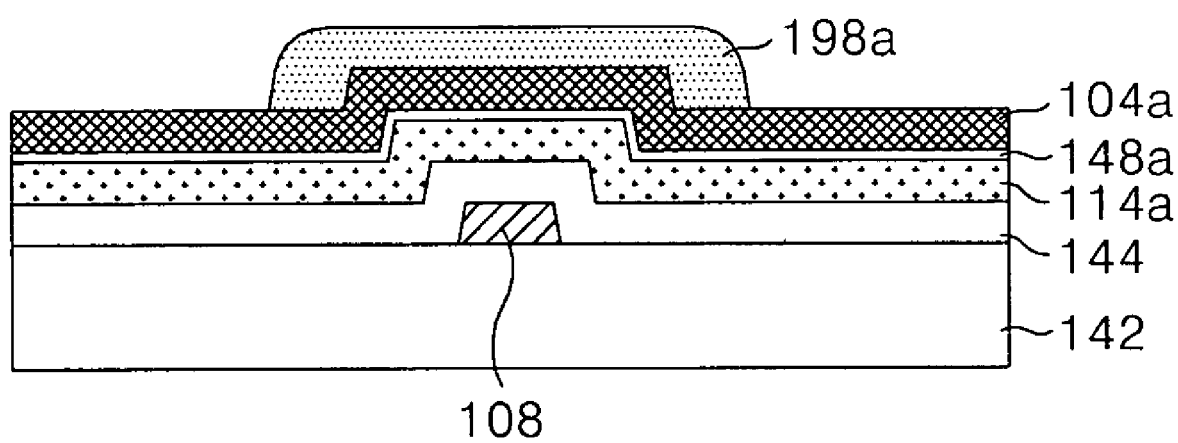
Figure 7D:
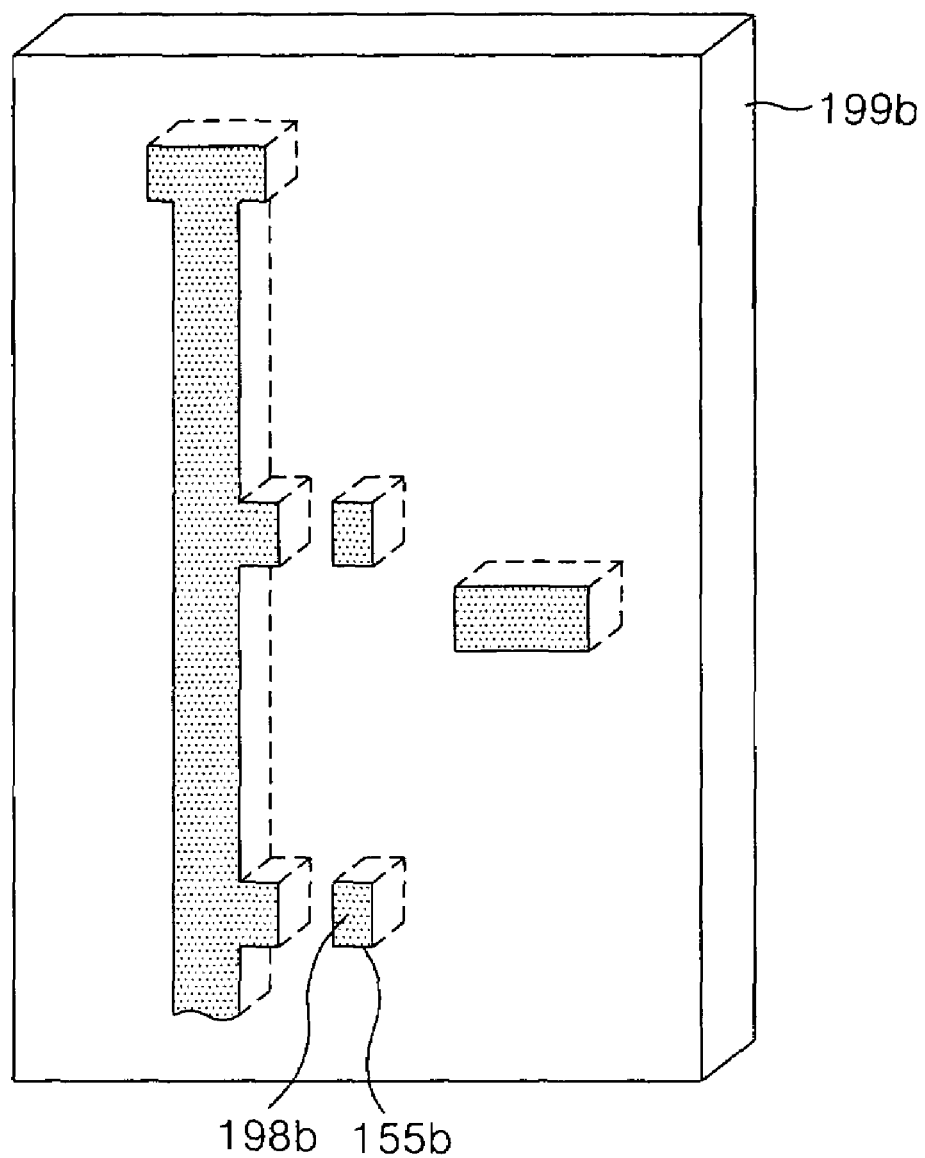
Figure 7E:
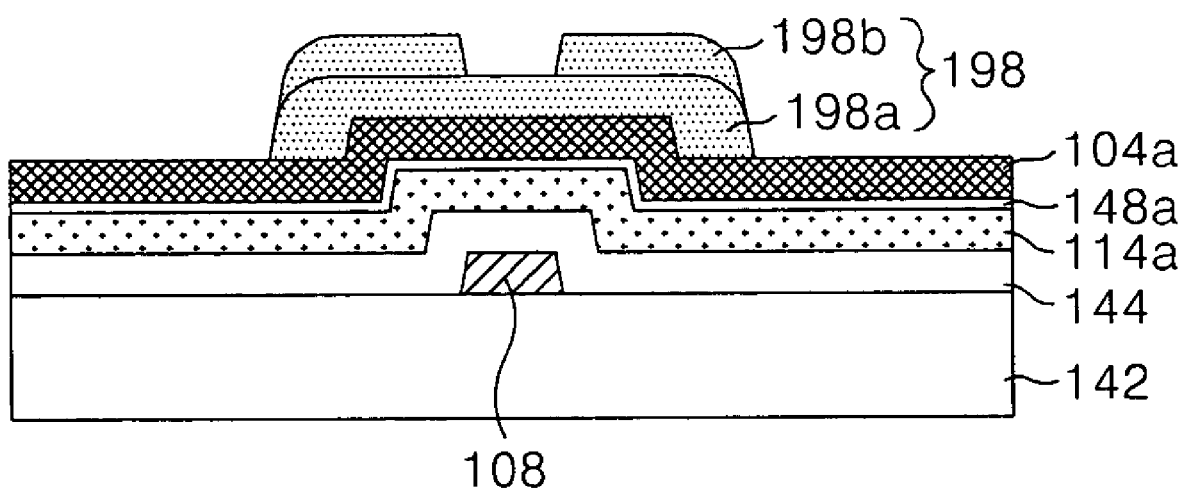

The printing roller 188 having the first resist 198a is contacted with the lower substrate 42 having the source/drain metal layer formed thereon and, as the same time, is rotated, thereby forming a first resist pattern 198a with the shape of the source/drain pattern on the lower substrate 142 having the source/drain metal layer 104a, as shown in FIG. 7C. Subsequently, as shown in FIG. 7D, a second printing plate 199b in which a second resist 198b is printed in a groove 155b with a shape of the source/drain pattern including the source electrode 110, the drain electrode 112 separated from the source electrode 110, the storage electrode 122 and the lower data pad electrode 136 is prepared. Thereafter, the second resist 198b is adhered in the printing roller 188. Next, the printing roller 188 having the second resist 198b is contacted with the lower substrate 142 provided with the first resist pattern 198a and, at the same time, is rotated, thereby forming a second resist pattern 198b on the source/drain pattern except for the channel portion, as shown in FIG. 7E. Hereby, the resist of the channel portion has a height lower than a resist of the source/drain pattern.

Subsequently, the source/drain metal layer is patterned by a wet etching process using the resist pattern 198 to thereby provide source/drain patterns including the data line 104, the source electrode 110, the drain electrode 112 being integral to the source electrode 110, and the storage electrode 122.

Next, the amorphous silicon layer and the n⁺ amorphous silicon layer are concurrently patterned by a dry etching process using the same resist pattern 198, to thereby provide the ohmic contact layer 148 and the active layer 114.

Figure 7F:
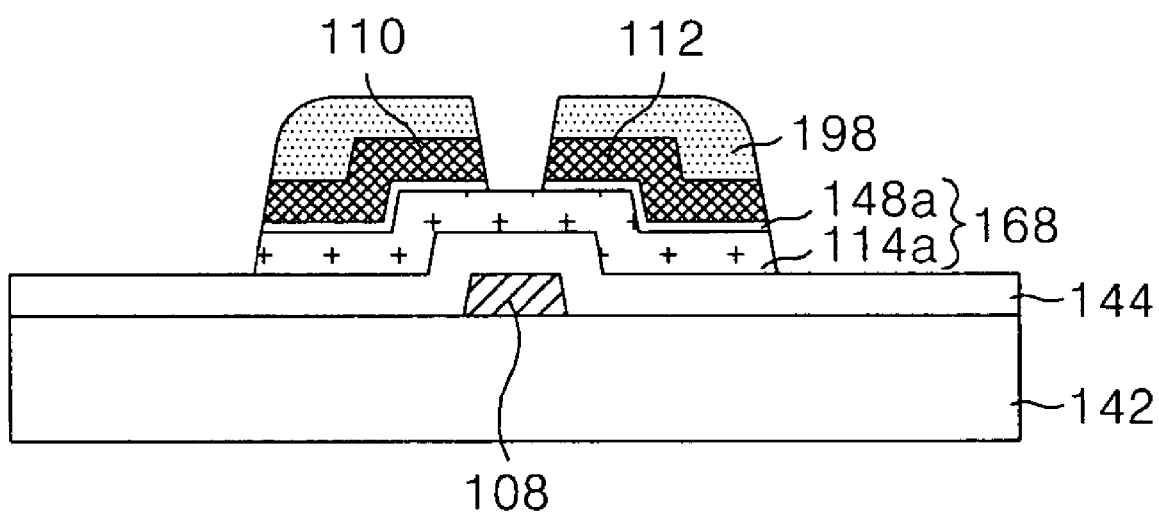

And then, the resist having a relatively low height in the channel portion is removed by an ashing process, and thereafter the source/drain pattern and the ohmic contact layer 148 of the channel portion are etched by a dry etching process using the resist pattern 198. Accordingly, as shown in FIG. 7F, the source electrode 110 is electrically separated from the drain electrode 112 and the active layer 114 of the channel portion is exposed. Thereafter, a remainder of the resist pattern 198 left on the source/drain pattern part is removed using a stripping process.

The gate insulating film 144 is made of an inorganic insulating material such as silicon oxide ($SiO_x$) and silicon nitride ($SiN_x$). A metal for source/drain pattern includes molybdenum (Mo), titanium, tantalum, a molybdenum alloy, copper (Cu), or an aluminum system metal.

A passivation film 150 is entirely formed on the gate insulating film 144 provided with the source/drain pattern by a deposition technique such as plasma enhanced chemical vapor deposition (PECVD).

Figure 6C:
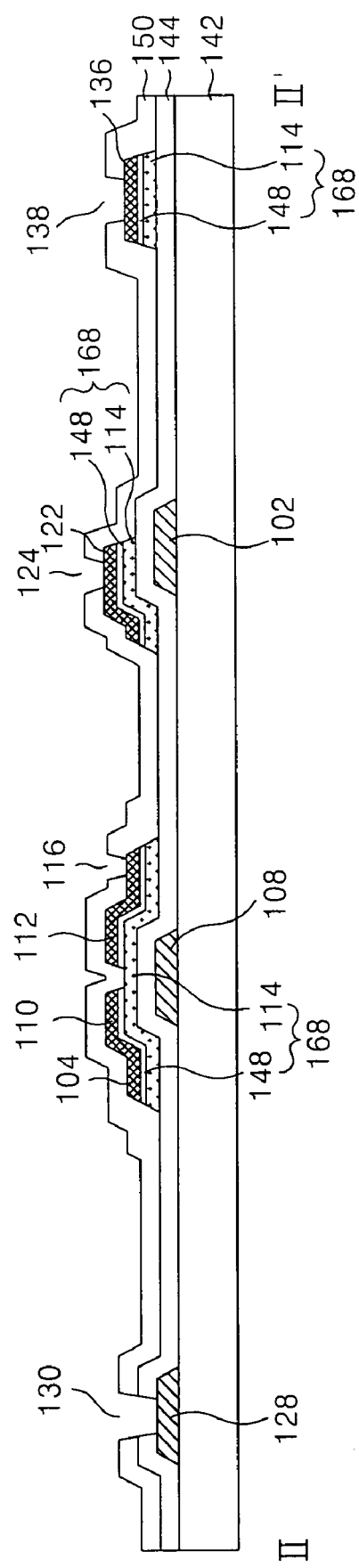
Figure 6D:
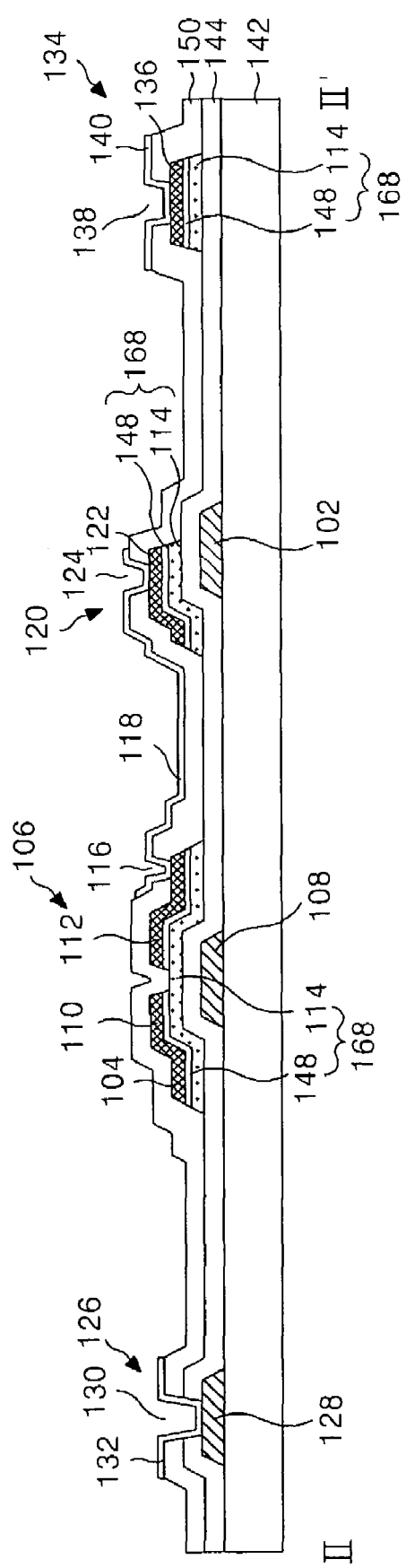

Thereafter, a resist pattern is formed on the lower substrate 142 provided with the passivation film 150 using a printing plate having a groove with a resist printed therein, and a printing roller. And then, the passivation film 150 is patterned by the resist pattern as a mask, to thereby form first to fourth contact holes 116, 124, 130 and 138 as shown in FIG. 6C. The first contact hole 116 is formed in such a manner to pass through the passivation film 150 and exposes the drain electrode 112, whereas the second contact hole 124 is formed in such a manner to pass through the passivation film 150 and exposes the storage electrode 122. The third contact hole 130 is formed in such a manner to pass through the passivation film 150 and the gate insulating film 144 and exposes the lower gate pad electrode 128, whereas the fourth contact hole 138 is formed in such a manner to pass through the passivation film 150 and exposes the lower data pad electrode 136.

The passivation film 150 is made of an inorganic insulating material such as a material of the gate insulating film 144 or an organic insulating material having a small dielectric constant such as an acrylic organic compound, BCB (benzocyclobutene) or PFCB (perfluorocyclobutane).

A transparent electrode material is entirely deposited on the passivation film 150 by a deposition technique such as sputtering and the like.

Then, a resist pattern is formed on the lower substrate 42 provided with the transparent electrode material by using a printing plate, in which a resist is printed in a groove with a shape of a transparent electrode pattern, and a printing roller. The transparent electrode material is patterned by using the resist pattern as a mask, to thereby form the transparent electrode pattern including the pixel electrode 118, the upper gate pad electrode 132, and the upper data pad electrode 140. The pixel electrode 118 is electrically connected, via the first contact hole 116, to the drain electrode 112 while being electrically connected, via the second contact hole 124, to the storage electrode 122 overlapping a pre-stage gate line 102. The upper gate pad electrode 132 is electrically connected, via the third contact hole 130, to the lower gate pad electrode 128. The upper data pad electrode 140 is electrically connected, via the fourth contact hole 138, to the lower data pad electrode 136. In this connection, the transparent electrode material is made of indium-tin-oxide (ITO), tin-oxide (TO) or indium-zinc-oxide (IZO).

In such a method of fabricating the thin film transistor array substrate included in the liquid crystal display panel according to the first embodiment of the present invention, the stepped resist pattern is formed by the first and the second printing plates 199a and 199b, and the printing roller, and the semiconductor pattern and the source/drain pattern are formed by the resist pattern. Accordingly, the present invention is capable of simplifying a fabricating process and reducing a material cost as compared with the related art.

Figure 8:
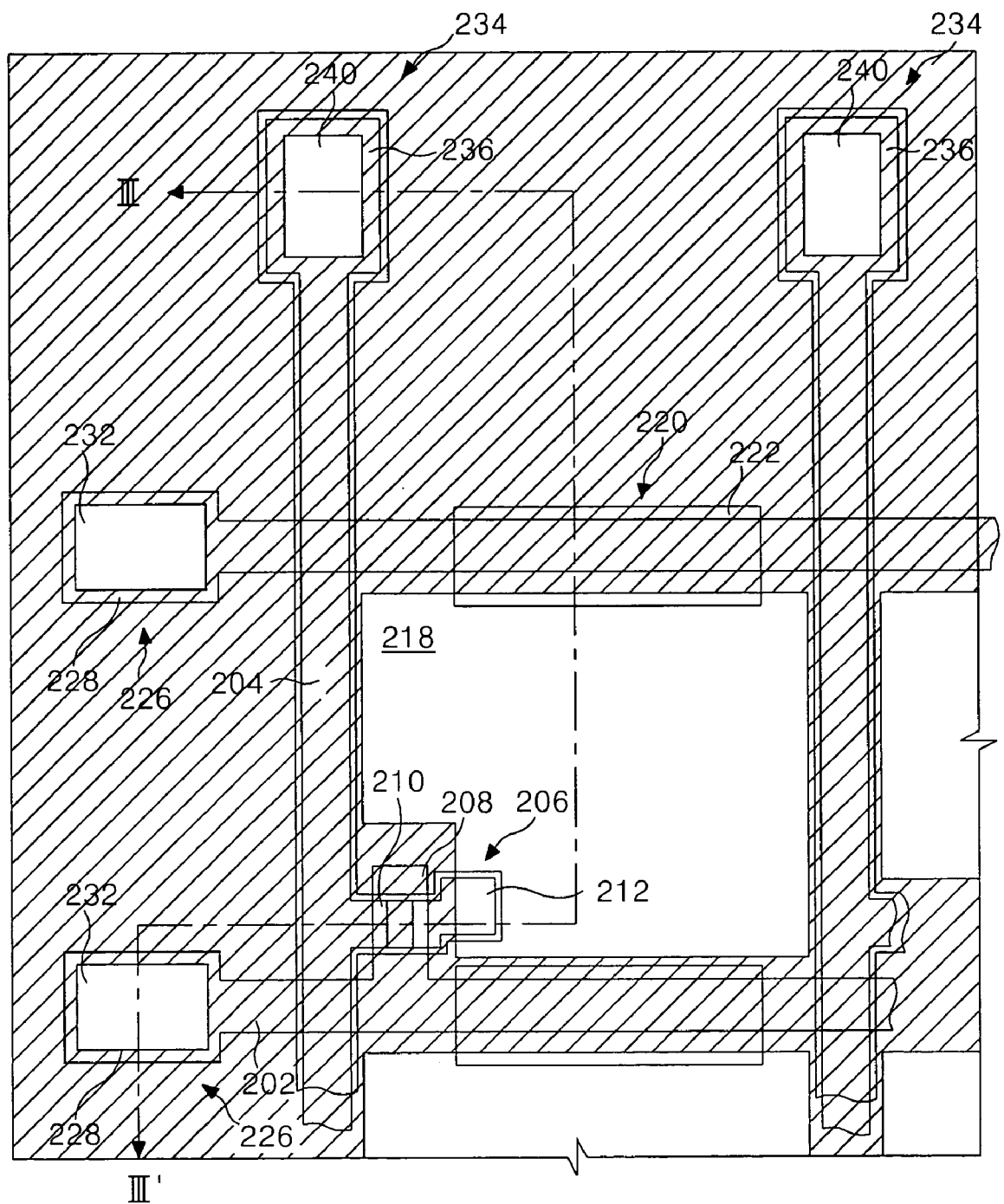
FIG. 8 is a plan view illustrating a thin film transistor array substrate according to a second embodiment of the present invention.
Figure 9:
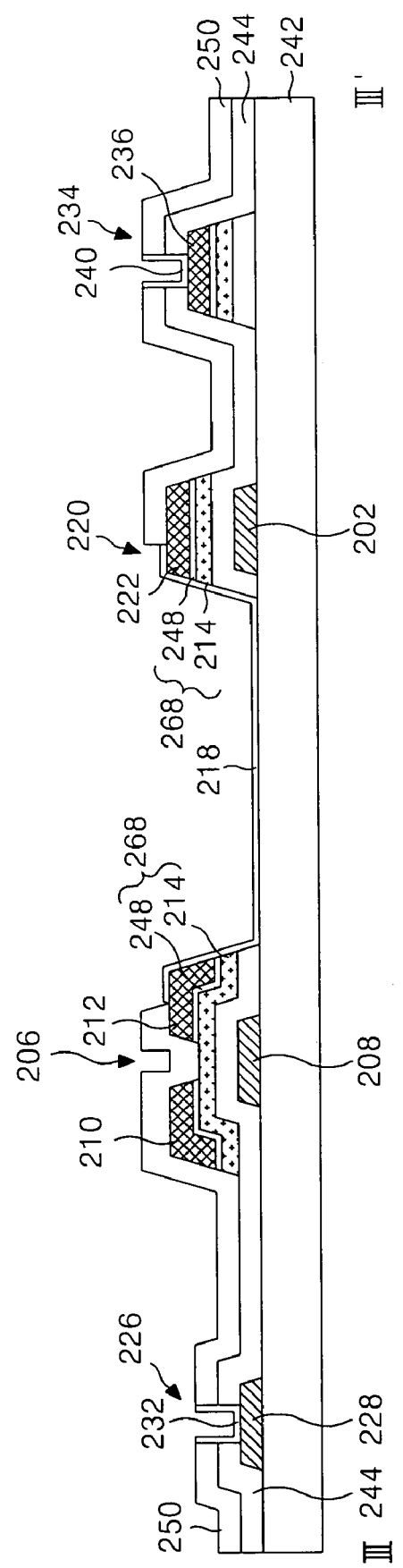
FIG. 9 is a sectional view of the thin film transistor array substrate taken along the line III-III' in FIG. 8.

FIG. 8 is a plan view illustrating a thin film transistor array substrate according to a second embodiment of the present invention, and FIG. 9 is a sectional view of the thin film transistor array substrate taken along the line III-III' in FIG. 8.

The thin film transistor array substrate, shown in FIG. 8 and FIG. 9, includes gate lines 202 and data lines 204 crossing with each other and having a gate insulating pattern 244 therebetween on a lower substrate 242, a thin film transistor 206 formed at every crossing, and a pixel electrode 218 formed in the cell region arranged by the crossing fashion. Further, the thin film transistor array substrate includes a storage capacitor 220 formed at an overlapped part of the pixel electrode 218 and a pre-stage gate line 202, a gate pad part 226 connected to the gate line 202 and a data pad part 234 connected to the data line 204.

The thin film transistor 206 includes a gate electrode 208 connected to the gate line 202, a source electrode 210 connected to the data line 204, a drain electrode 212 connected to a pixel electrode 218, and a semiconductor pattern 268 including an active layer 214 which defines a channel between the source electrode 210 and the drain electrode 212 and overlapping the gate electrode 208 with the gate insulating pattern 244 therebetween.

The semiconductor pattern 268 includes the channel portion between the source electrode 210 and the drain electrode 212, and the active layer 114 which overlaps the source electrode 210, the drain electrode 212, the data line 204, and the lower data electrode 236, and which overlaps the gate line 202 with the gate insulating pattern 244 overlapping the storage electrode 222 therebetween. The semiconductor pattern 268 further includes an ohmic contact layer for making an ohmic contact with the source electrode 210, the drain electrode 212, the storage electrode 222, the data line 204 and the lower data pad electrode 236 on the active layer 214.

The pixel electrode 218 is connected to the drain electrode 212 of the thin film transistor 206 exposed toward an exterior of a passivation pattern 250.

The storage capacitor 220 includes a pre-stage gate line 202, a storage electrode 222 overlapping the pre-stage gate line 202 having the gate insulating pattern 244, the active layer 214 and the ohmic contact layer 248 therebetween, and connected to the pixel electrode 218. Herein, the pixel electrode 218 is connected to the storage electrode 222 exposed toward an exterior of the passivation pattern 250. The gate line 202 is connected to a gate driver (not shown) through the gate pad part 226. The gate pad part 226 includes a lower gate pad electrode 228 extending from the gate line 202 and an upper gate pad electrode 232 connected to the lower gate pad electrode 228.

The data line 204 is connected to the data driver (not shown) through the data pad part 234. The data pad part 234 includes the lower data pad electrode 236 extending from the data line 204 and an upper data pad electrode 240 connected to the lower data pad electrode 236. The data pad part 234 further includes the gate insulating pattern 244, the active layer 214 and the ohmic contact layer 248 formed between the lower data pad electrode 236 and the lower substrate 242.

The gate insulating pattern 244 and the passivation pattern 250 are formed at an area where the pixel electrode 218, the upper gate pad electrode 232 and the upper data pad electrode 240 are not formed.

A method of fabricating the thin film transistor array substrate according to a second embodiment of the present invention will be described with reference to FIGS. 10A to 13.

Figure 10A:
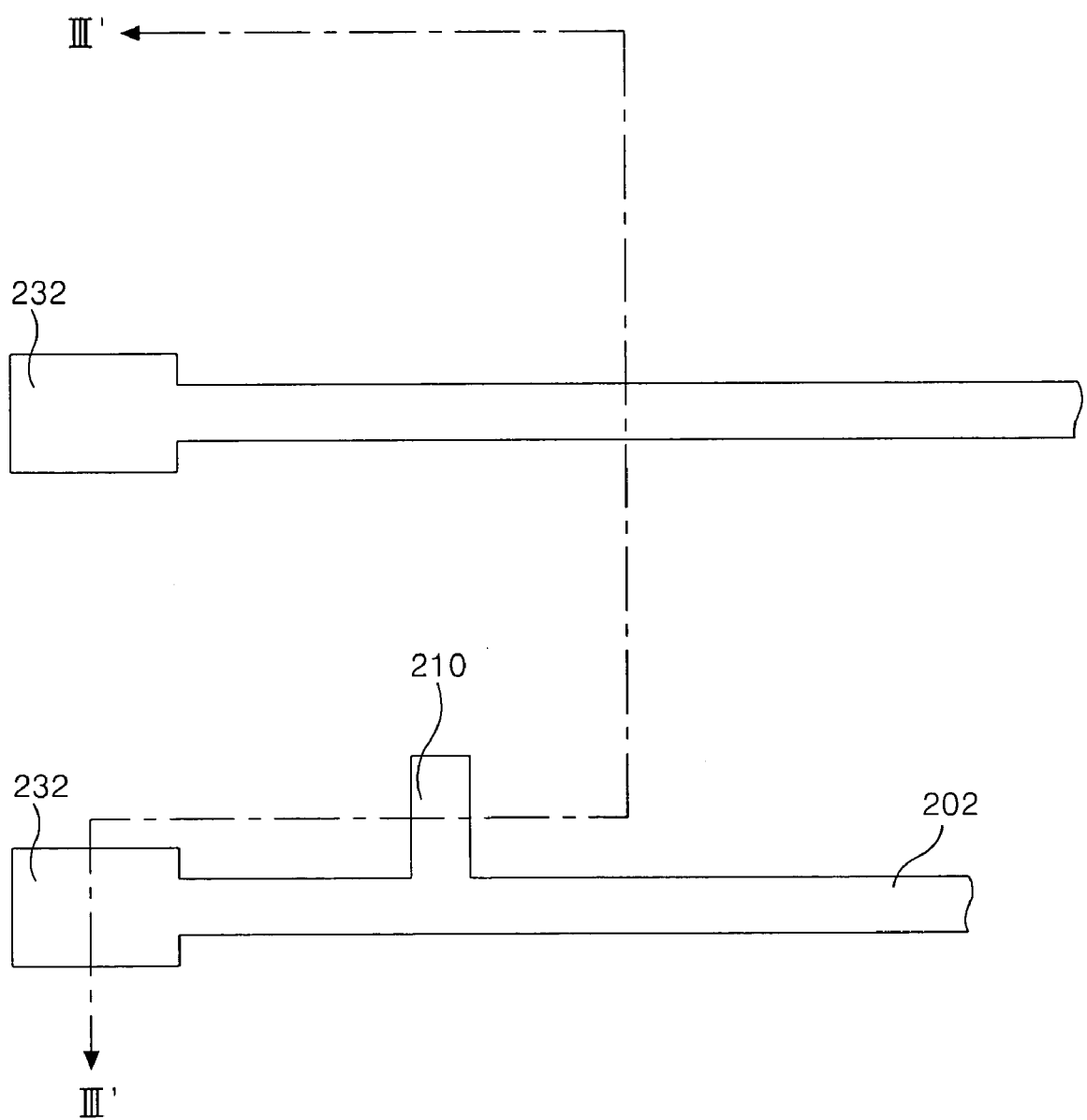
FIGS. 10A to 13D are configurations illustrating a method of fabricating the thin film transistor array substrate shown in FIG. 9.
Figure 10B:
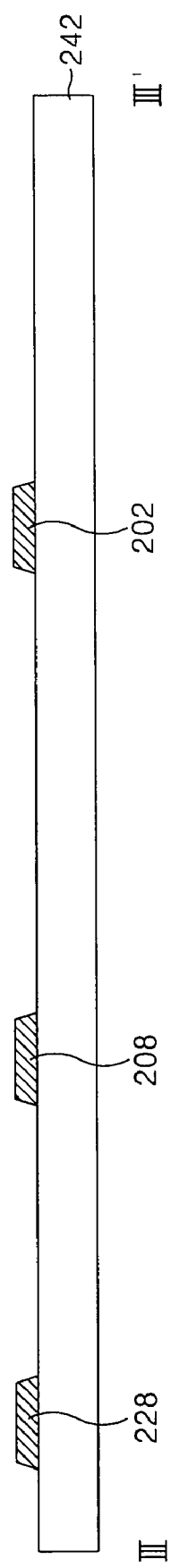

First of all, FIGS. 10A and 10B are a plan view and a sectional view illustrating a gate pattern formed on a lower substrate 242 among the method of fabricating the thin film transistor array substrate according to the second embodiment of the present invention.

A gate metal layer is formed by a deposition method such as a sputtering method on the lower substrate 242. Thereafter, a resist pattern is formed on the lower substrate provided with the gate metal layer by using a printing plate, in which a resist is printed in a groove of a gate pattern shape including the gate line 202, the gate electrode 208 and the lower gate pad electrode 228, and a printing roller. The gate metal layer is patterned by an etching process using the resist pattern as a mask. Accordingly, as shown in FIG. 10B, the gate pattern, including the gate line 202, the gate electrode 208 and the lower gate pad electrode 228, are formed. Metals for the gate includes chrome (Cr), Mo/W, chrome/aluminum (Cr/Al), copper (Cu), molybdenum/aluminum (Mo/Al), molybdenum/aluminum(neodymium) Mo/Al(Nd), chrome/aluminum(neodymium) Cr/Al(Nd) and the like, which are used in a form of a single-layer structure or a double-layer structure.

Figure 11A:
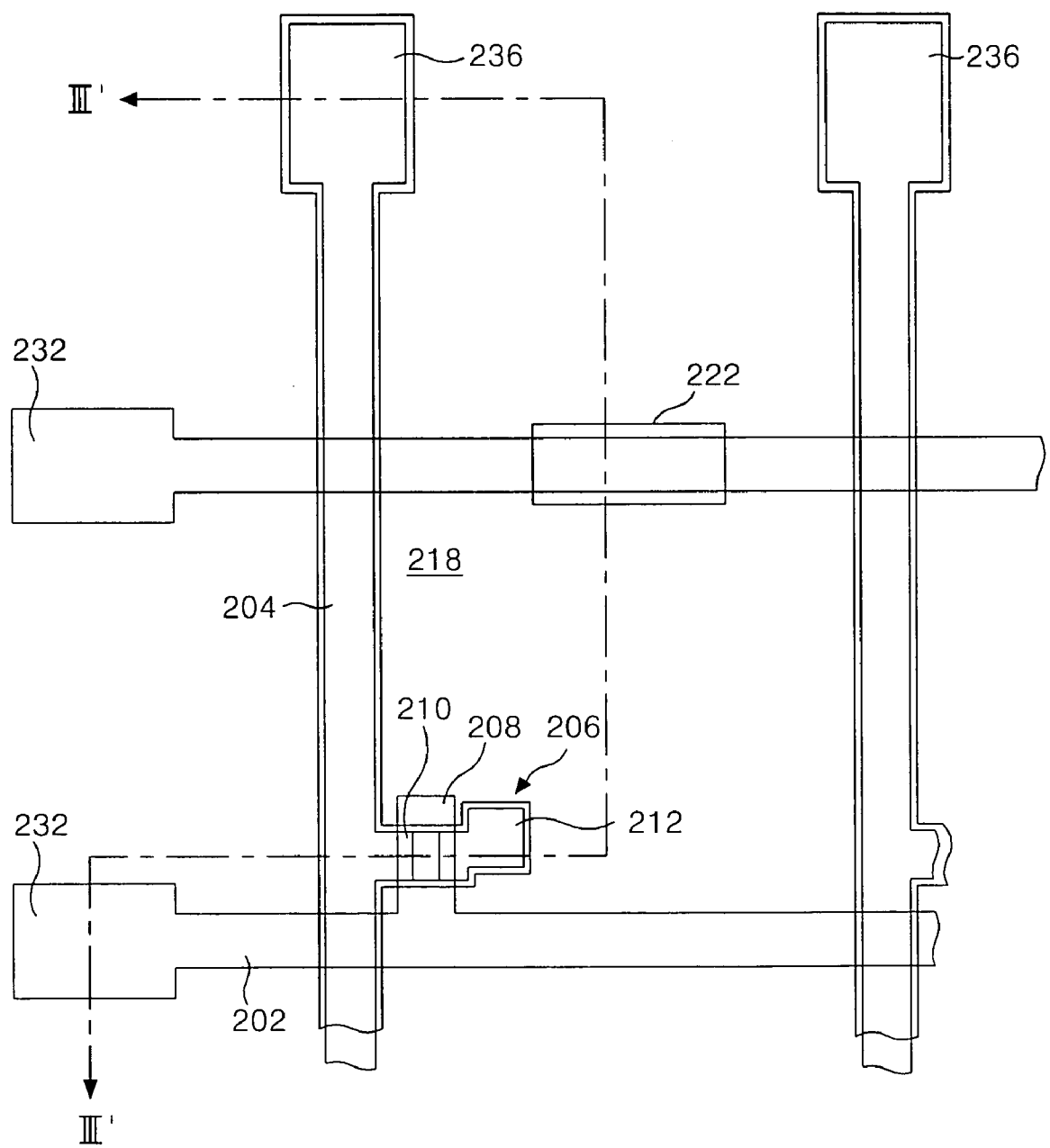
Figure 11B:
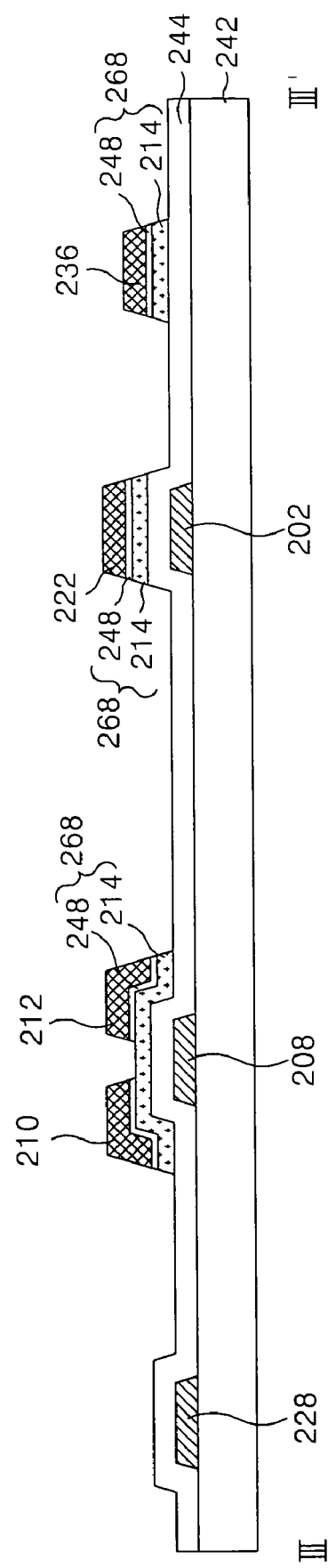

A gate insulating film, an amorphous silicon layer and a n+ amorphous silicon layer and a source/drain metal layer are sequentially formed on the lower substrate 242 having the gate pattern thereon by a deposition technique such as plasma enhanced chemical vapor deposition (PECVD) and sputtering. Thereafter, a semiconductor pattern 268 and a source/drain pattern are formed by a printing roller and a printing plate having a printed resist, as shown in FIGS. 11A and 11B.

A process of the semiconductor pattern 268 and the source/drain pattern will be described with reference to FIGS. 12A to 12F.

Figure 12A:
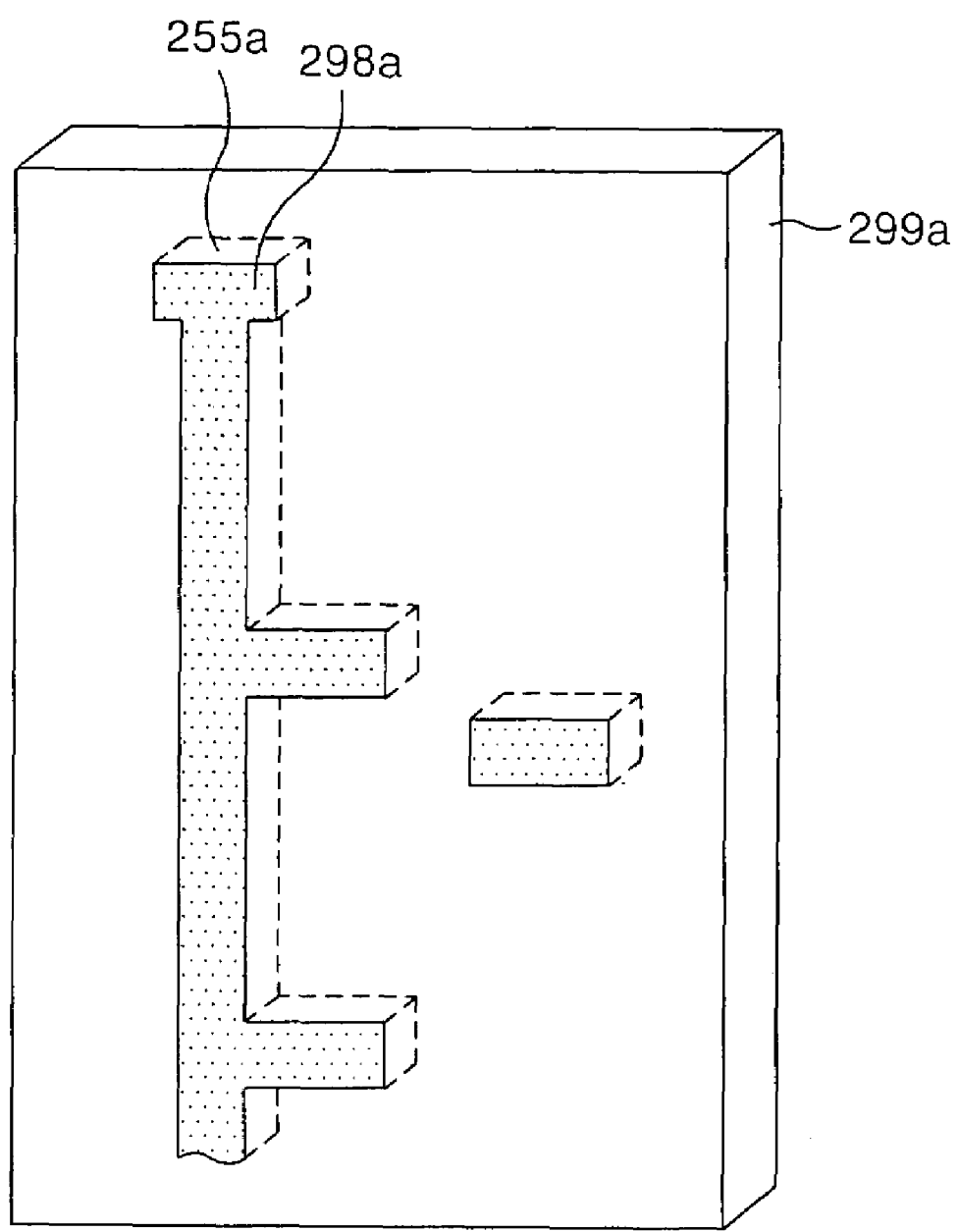
Figure 12B:
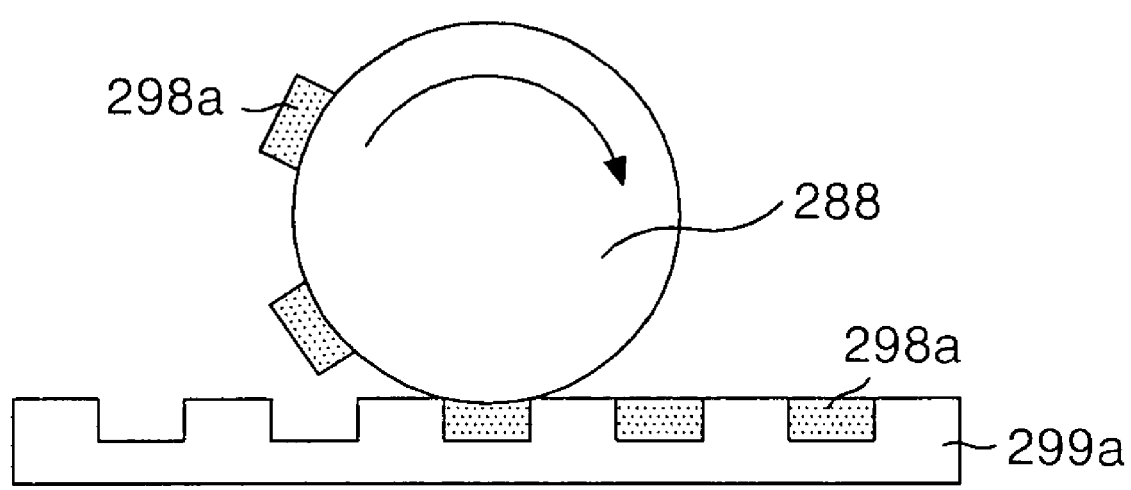

First of all, as shown in FIG. 12A, a first printing plate 299a in which a first resist 298a is printed in a groove 255a of the source/drain pattern shape including the source electrode 210, the drain electrode 212 being integral to the source electrode 210, the storage electrode 222 and the lower data pad electrode 236 is prepared. Subsequently, a printing roller 288 is contacted with the first printing plate 299a and, at the same time, is rotated, thereby adhering or transferring the first resist 298a to the printing roller 288, as shown in FIG. 12B.

Figure 12C:
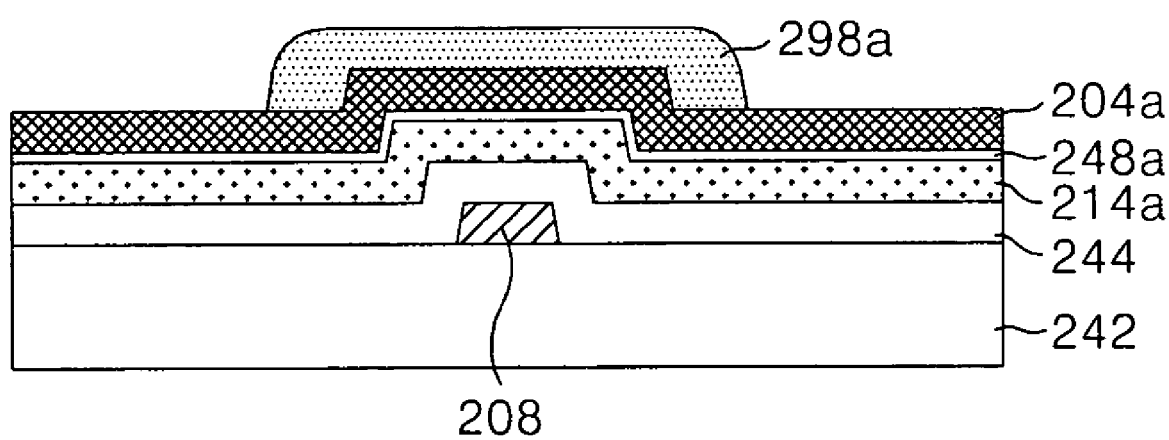
Figure 12D:
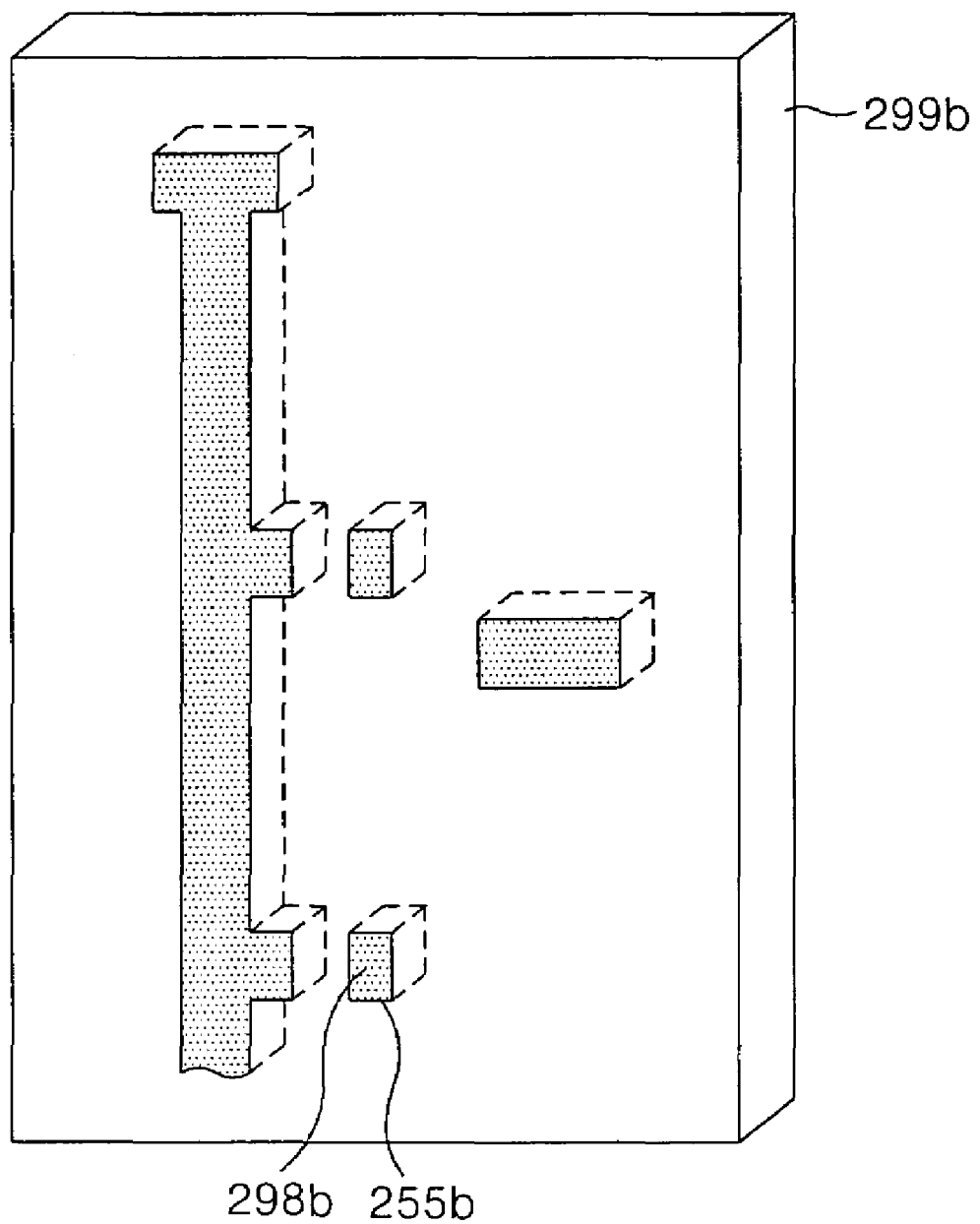
Figure 12E:
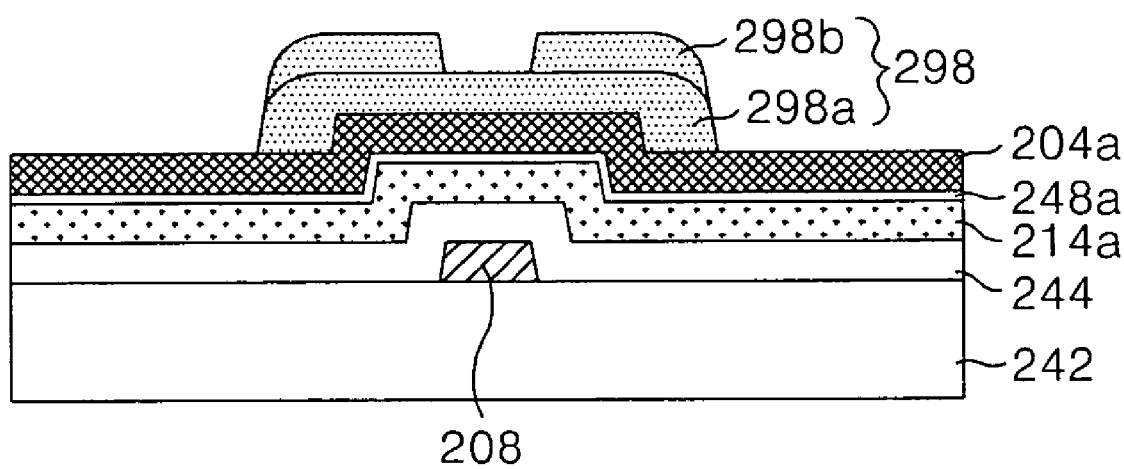

The printing roller 288 having the first resist 298a is contacted with the lower substrate 242 having the source/drain metal layer and, as the same time, is rotated, thereby forming a first resist pattern 298a of the source/drain pattern shape on the lower substrate 242 provided with the source/drain metal layer, as shown in FIG. 12C. Subsequently, as shown in FIG. 12D, a second printing plate 299b in which a second resist 298b is printed in a groove 255b of the source/drain pattern shape including the source electrode 210, the drain electrode 212 separated from the source electrode 210, the storage electrode 222 and the lower data pad electrode 236 is prepared. Thereafter, the second resist 298b is adhered in the printing roller 288. Next, the printing roller 288 having the second resist 298b is contacted with the lower substrate 242 provided with the first resist pattern 298a and, at the same time, is rotated, thereby forming a second resist pattern 298b on the source/drain pattern except for the channel portion, as shown in FIG. 12E. Hereby, the resist pattern 298 of the channel portion has a lower height than a resist pattern of the source/drain pattern part.

Subsequently, the source/drain metal layer is patterned by a wet etching process using the resist pattern 298 to thereby provide the source/drain pattern including the data line 204, the source electrode 210, the drain electrode 212 being integral to the source electrode 210, and the storage electrode 222.

Next, the amorphous silicon layer and the n+ amorphous silicon layer are concurrently patterned by a dry etching process using the same photo-resist pattern 298 to thereby provide the ohmic contact layer 248 and the active layer 214.

Figure 12F:
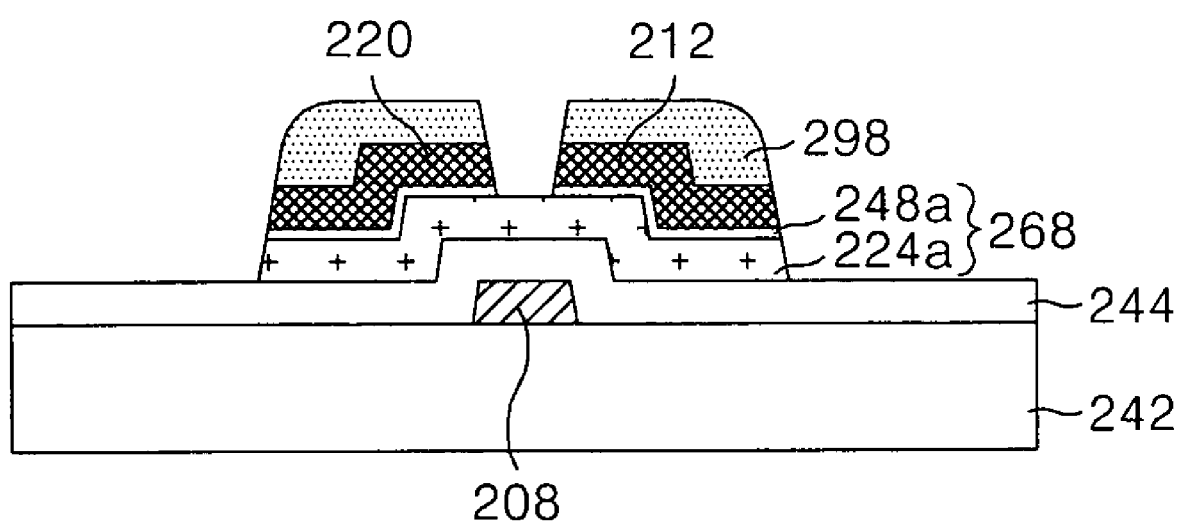

Also, the resist pattern 298 having a relatively low height in the channel portion is removed by an ashing process, and thereafter the source/drain pattern and the ohmic contact layer 248 of the channel portion are etched by a dry etching process using the remaining resist pattern 298 as a mask. Accordingly, as shown in FIG. 12F, the source electrode 210 is electrically separated from the drain electrode 212 and the active layer 214 of the channel portion is exposed. Thereafter, the remainder of the resist pattern 298 left on the source/drain pattern part is removed using a stripping process.

The gate insulating film 244 is made of an inorganic insulating material such as silicon oxide ($SiO_x$) and silicon nitride ($SiN_x$). A metal for source/drain pattern includes molybdenum (Mo), titanium, tantalum, a molybdenum alloy (Mo alloy), copper (Cu), or an aluminum system metal.

FIGS. 13A to 13D are a plan view and sectional views of a substrate including the gate insulating pattern 240 and the passivation pattern 250 in the method of fabricating the thin film transistor array substrate according to the second embodiment of the present invention.

Figure 13A:
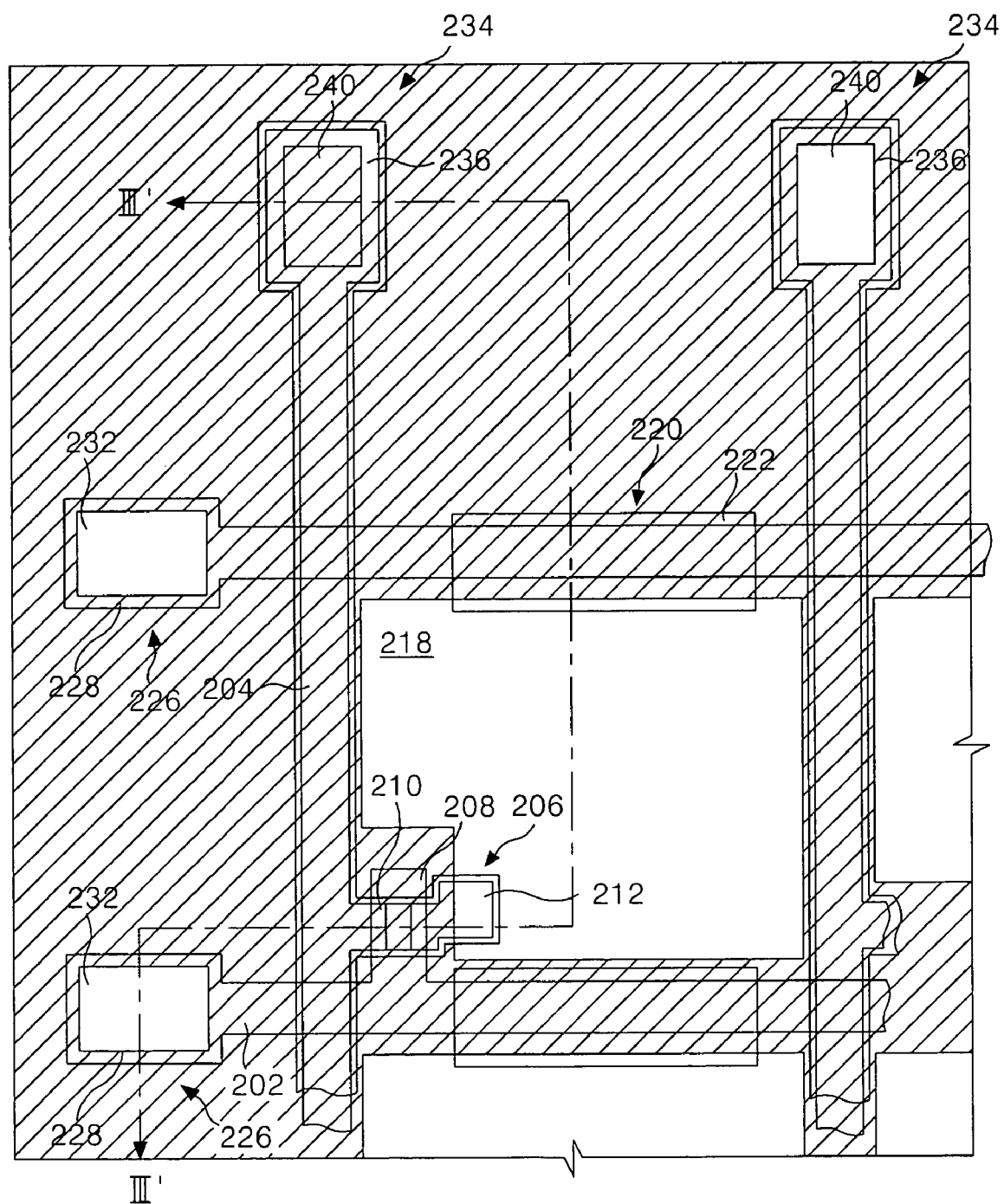
Figure 13B:
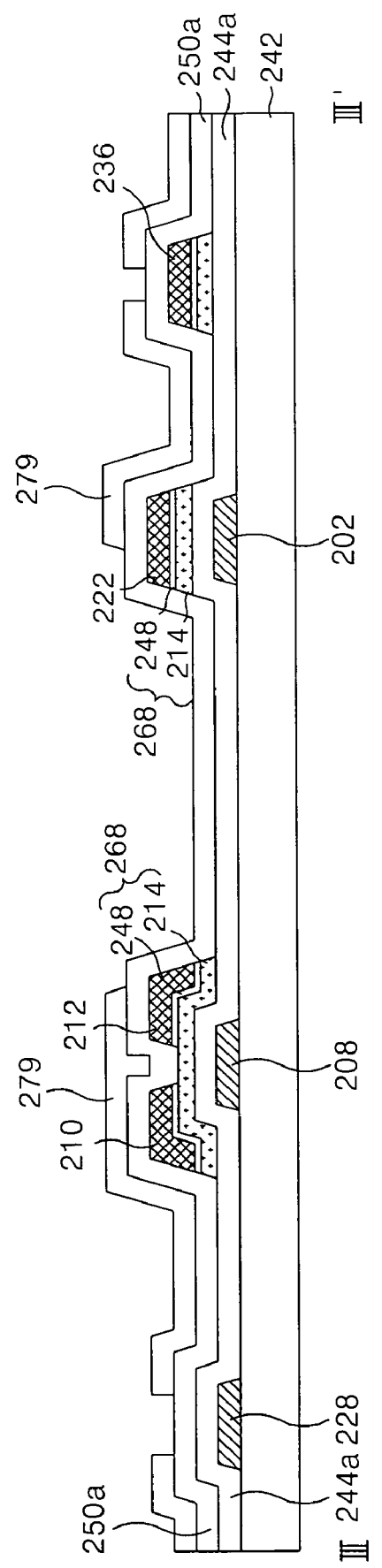
Figure 13C:
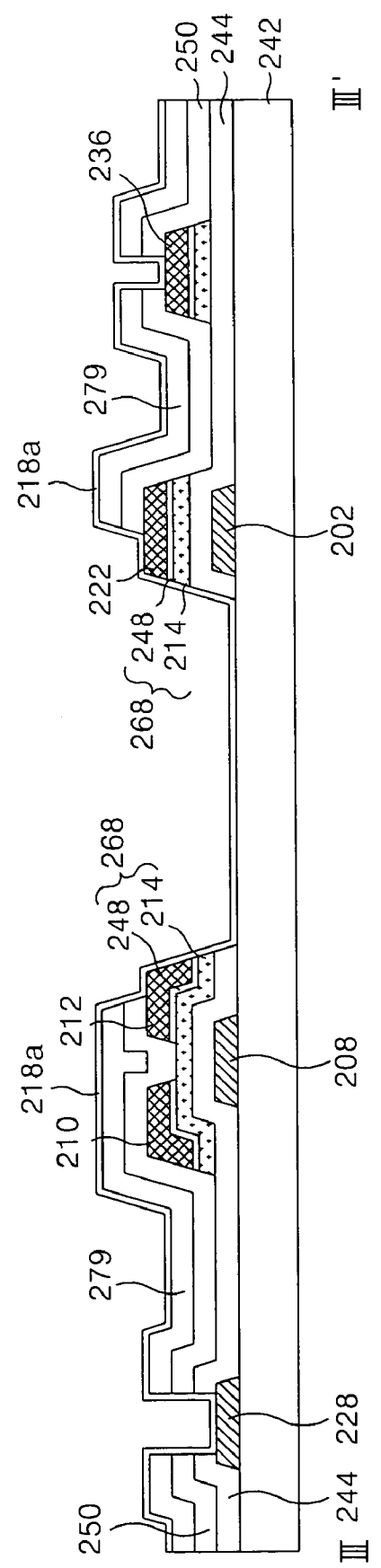
Figure 13D:
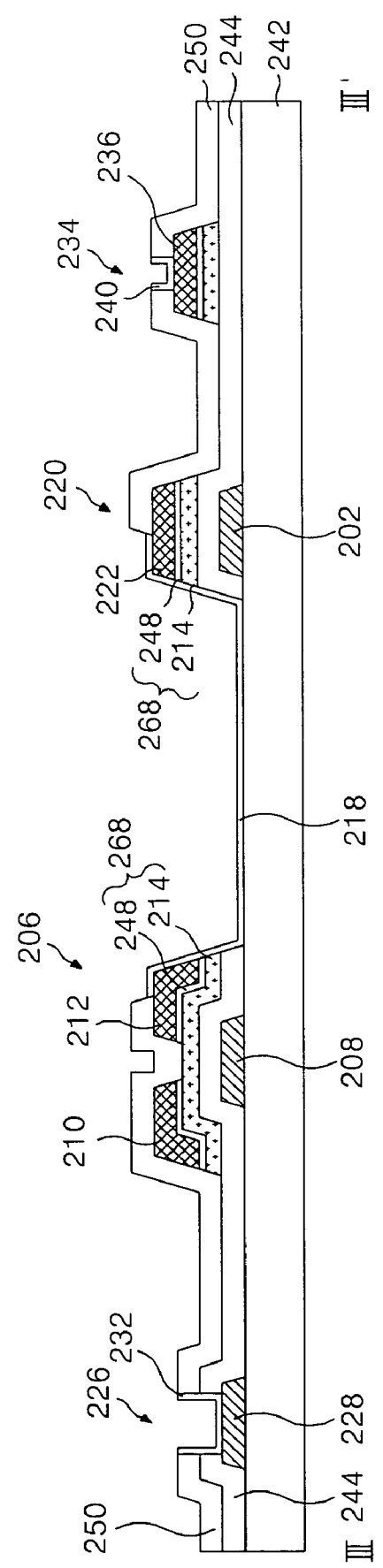

More specifically, a passivation film 250a, made of an inorganic insulating material such as silicon oxide ($SiO_x$) or silicon nitride ($SiN_x$), or an organic insulating material such as an acrylic organic compound having a small dielectric constant, BCB (benzocyclobutene) or PFCB .(perfluorocyclobutane), is deposited by a deposition method such as a sputtering method on the gate insulating film 244a having the source/drain pattern formed thereon. Thereafter, a resist pattern 279 is formed on the lower substrate 242 having the passivation film 250a deposited thereon using a printing plate having a resist printed thereon and a printing roller, as shown in FIG. 13B. Subsequently, the passivation film 250a and the gate insulating film 244a are patterned by dry-etching using the resist pattern 279 as a mask, to thereby form a passivation pattern 250 and the gate insulating pattern 244 at an area except for the other area where a transparent electrode pattern will be formed. Thereafter, a transparent electrode material 218a is entirely deposited on the lower substrate 242 having the resist pattern 279 by a deposition technique such as a sputtering method. In this connection, the transparent electrode material is made of indium-tin-oxide (ITO), tin-oxide (TO) or indium-zinc-oxide (IZO). The resist pattern 279 is then removed from the thin film transistor array substrate having the transparent electrode material 218a deposited thereon by a stripping process using a lift-off method. At this time, the transparent electrode material 218a deposited on the resist pattern 279 is removed together with the resist pattern 279 being taken off, thereby, as shown in FIG. 13D, to form a transparent pattern including the upper gate pad electrode 232, the pixel electrode 218 and the upper data pad electrode 240.

The upper gate pad electrode 232 is formed to cover the lower gate pad electrode 228, the pixel electrode 218 is electrically connected to the drain electrode of the thin film transistor 206 and electrically connected to the storage electrode 222 of the storage capacitor 220, and the upper data pad electrode 240 is electrically connected to the lower data pad electrode 236.

As described above, the method of fabricating the thin film transistor array substrate included in the liquid crystal, display panel according to the second embodiment of the present invention is capable of simplifying a fabricating process by using the lift-off method patterning the transparent electrode on the resist pattern through the use of the stripping process of the resist pattern used for the patterning processes of the gate insulating film and the passivation film.

Also, the present method forms the stepped resist by using the first and the second printing plate, and the printing roller, and then, forms the semiconductor pattern and the source/drain pattern using. Accordingly, the present invention is capable of reducing the number of stripping processes to thereby simplify the fabricating process and reduce a material cost as compared with the related art.

Figure 14:
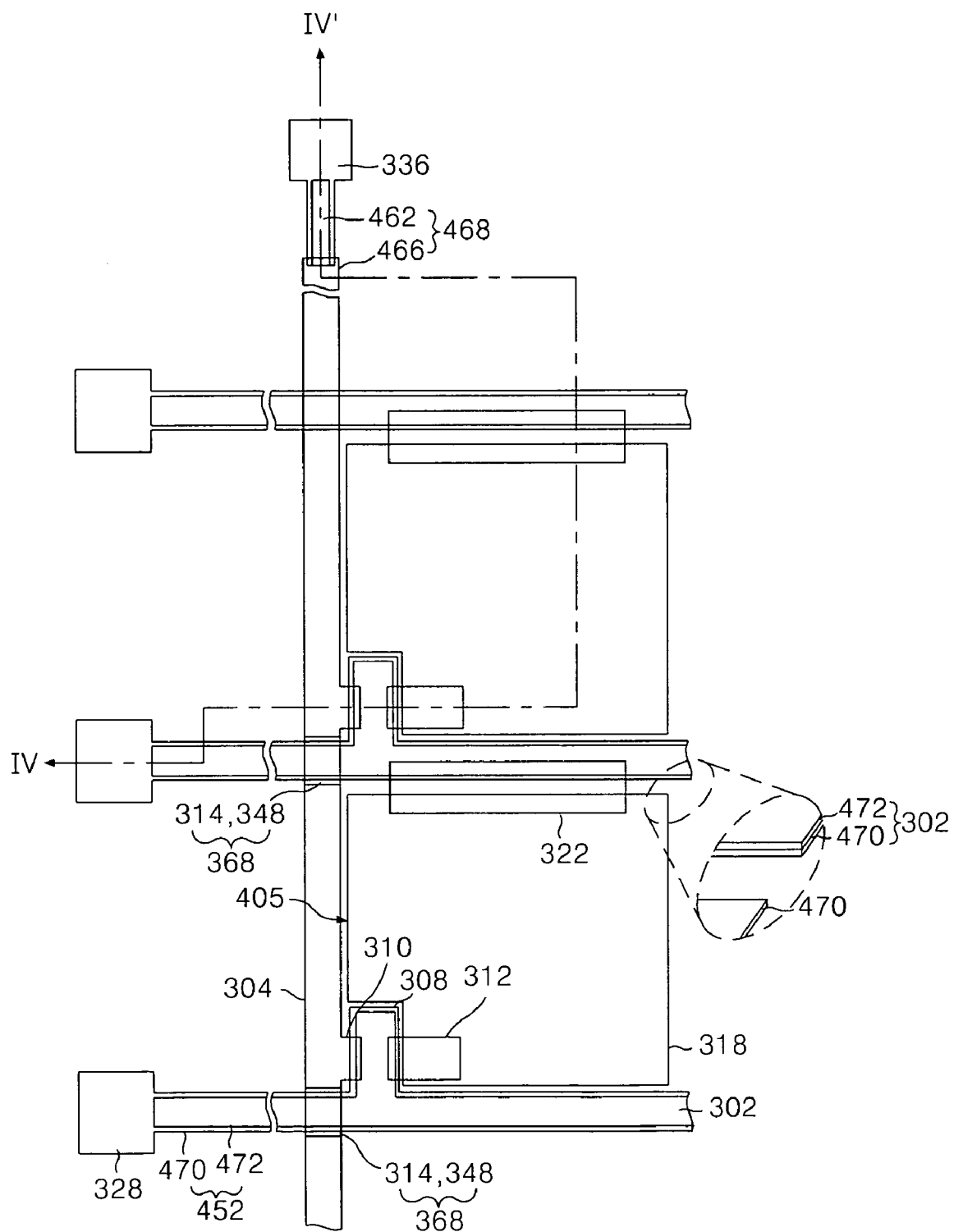
FIG. 14 is a plan view illustrating a thin film transistor array substrate according to a third embodiment of the present invention.
Figure 15:
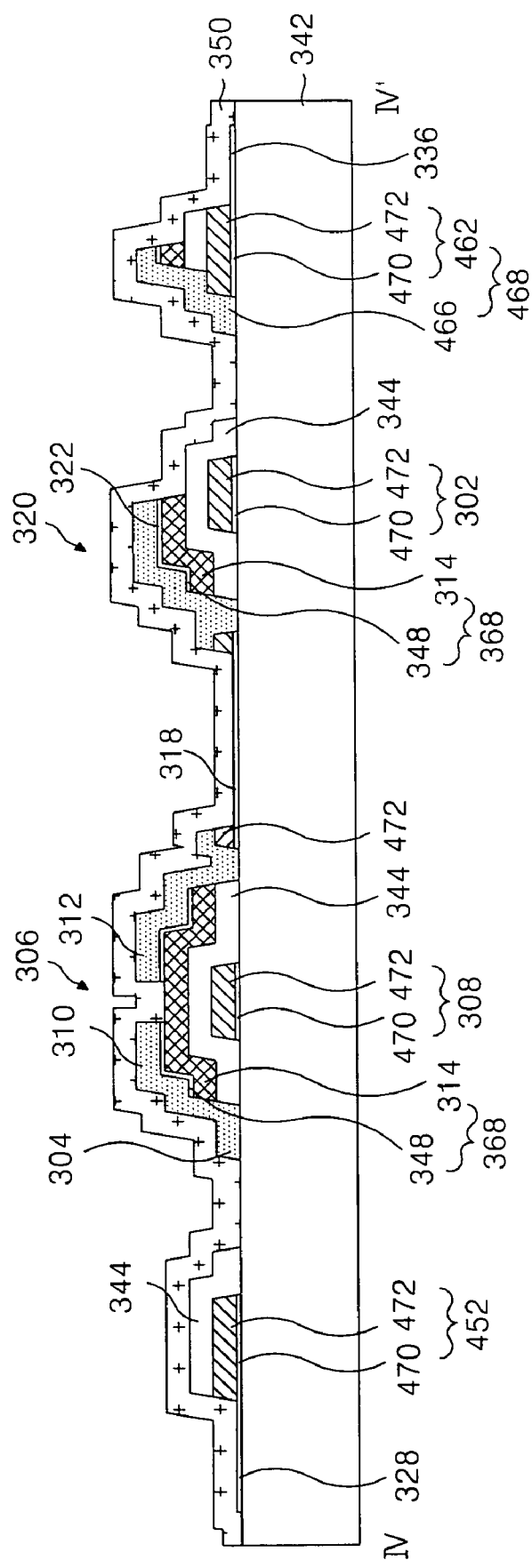
FIG. 15 is a sectional view of the thin film transistor array substrate taken along the line IV-IV' in FIG. 14.

FIG. 14 is a plan view illustrating a thin film transistor array substrate according to a third embodiment of the present invention, and FIG. 15 is a sectional view of the thin film transistor array substrate taken along the line III-III' in FIG. 14.

The thin film transistor array substrate, shown in FIG. 14 and FIG. 15, includes gate lines 302 and data lines 304 crossing with each other and having a gate insulating pattern 344 therebetween on a lower substrate 342, a thin film transistor 306 formed at every crossing, a pixel electrode 318 formed in the cell region arranged by the crossing, a storage capacitor 320 formed at an overlapped part of the pixel electrode 318 and a pre-stage gate line 302, a gate pad 328 extending from the gate line 302, and a data pad 336 extending from the data line 304.

The gate line 302 supplying a gate signal and the data line 304 supplying a data signal are formed in a structure crossing each other to define a pixel region.

The thin film transistor 306, in response to a gate signal supplied to the gate line 302, makes a pixel signal supplied to the data line 304 to be charged to the pixel electrode 318 and be maintained therein. To this end, the thin film transistor 306 includes a gate electrode 308 connected to the gate line 302, a source electrode 310 connected to the data line 304, a drain electrode 312 connected to a pixel electrode 318. The thin film transistor 306 further includes a semiconductor pattern 368 defining a channel portion between the source electrode 310 and the drain electrode 312 and overlapping the gate electrode 308 with the gate insulating pattern 344 therebetween.

A gate pattern including the gate electrode 308 and the gate line 302 is formed with a structure in which a transparent conductive film 470 and a gate metal film 472 on the transparent conductive film 470 are stacked.

The semiconductor pattern 368 forms the channel portion between the source electrode 210 and the drain electrode 212, and includes an active layer 314 partially overlapping the gate pattern with the gate insulating pattern 344. The semiconductor pattern 368 further includes an ohmic contact layer 348 formed on the active layer 314 to make an ohmic contact with the storage electrode 322, the source electrode 310 and the drain electrode 312.

The pixel electrode 318 is formed at the pixel region 405 and is directly connected to the drain electrode 312 of the thin film transistor. The pixel electrode 318. includes the transparent conductive film 470 formed at the pixel region 405 and the gate metal film 472 formed on the transparent conductive film 470 of a region overlapped with the drain electrode 312 and the storage electrode 322.

The storage capacitor 320 includes a pre-stage gate line 302 and a storage electrode 322, wherein the storage electrode 322 overlaps the pre-stage gate line 302 with the gate insulating pattern 344, the active layer 314 and the ohmic contact layer 348 therebetween, and is connected to the pixel electrode 318.

The gate pad 328 is connected to a gate driver (not shown) to supply a gate signal generated from the gate driver to the gate line 302 through a gate link 452. The gate pad 328 is formed with a structure in which the transparent conductive film 470, extending from the gate link 452 connected to the gate line 302, is exposed. Herein, the gate link 452 includes the transparent conductive film 470 and the gate metal layer 472 formed on the transparent conductive film 470.

The data pad 336 is connected to a data driver (not shown) to supply a data signal generated from the data driver to the data line 304 through a data link 468. The data pad 336 is formed with a structure in which the transparent conductive film 470, extending from the data link 468 connected to the data line 304, is exposed. Herein, the data link 468 includes a lower data link electrode 462 having a structure in which the transparent conductive film 470 and the gate metal layer 472 are stacked, and an upper data link electrode 466 connected to the data line 304. Between the lower data link electrode 462 and the upper data link electrode 466, the gate insulating pattern 344, the active layer 314 and the ohmic contact layer 348 may be formed, or may not be formed for the sake of a simplified configuration.

Hereinafter, a method of fabricating the thin film transistor array substrate according to the third embodiment of the present invention will be described as follows.

Figure 16A:
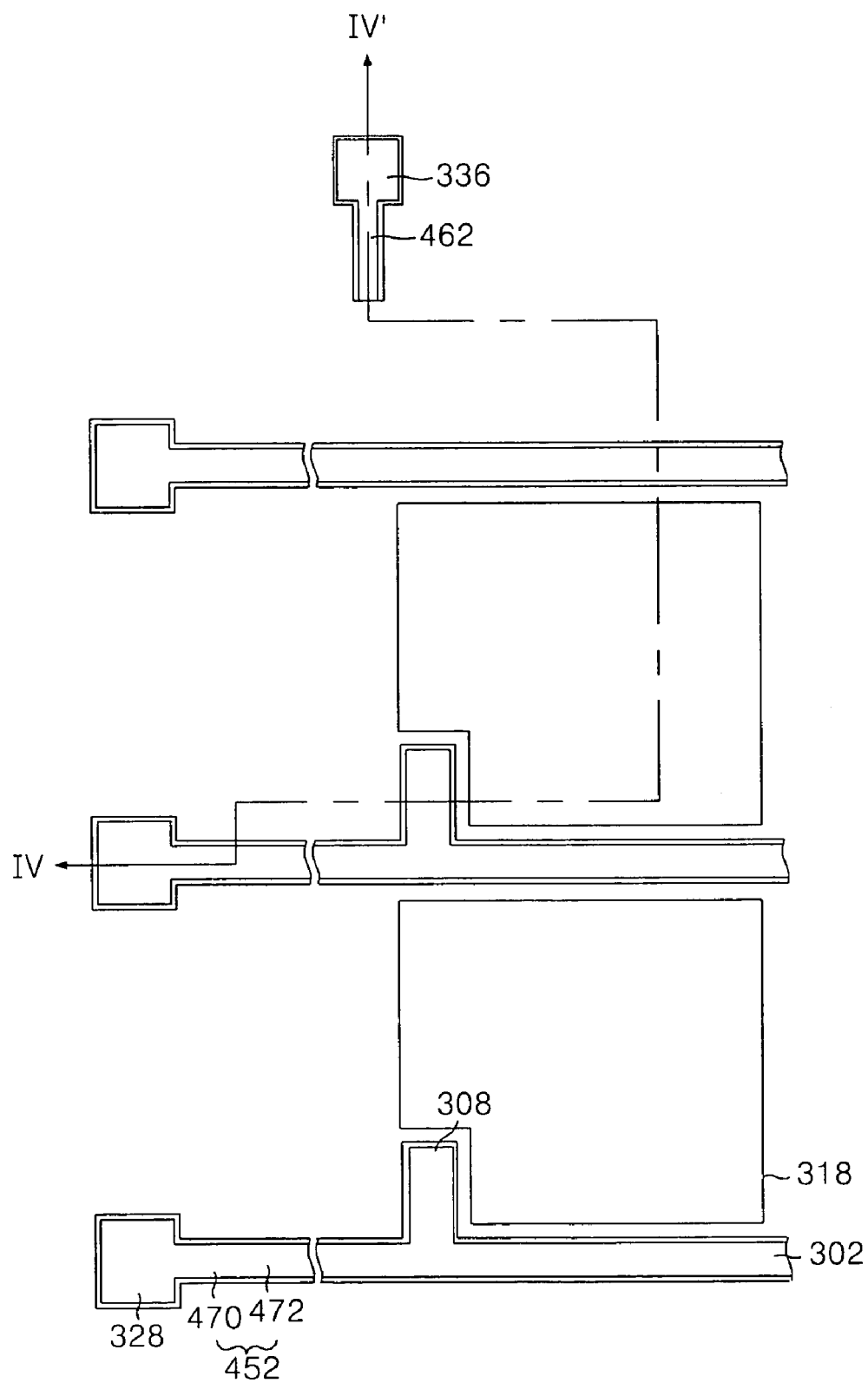
FIGS. 16A to 19E are configurations illustrating a method of fabricating the thin film transistor array substrate shown in FIG. 15.
Figure 16B:
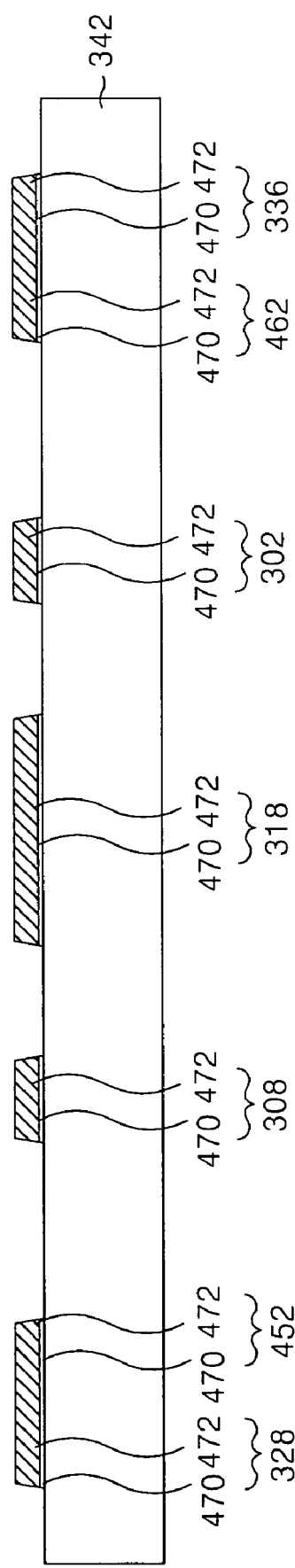

FIGS. 16A and 16B are configurations illustrating a formation of the gate pattern including the pixel electrode 318, the gate line 302, the gate electrode 308, the gate link 452, the gate pad 328, the data pad 336 and the lower data link electrode 462 in the method of fabricating the thin film transistor array substrate according to the third embodiment of the present invention.

More specifically, the transparent conductive film 470 and the gate metal film 472 are formed by a deposition method such as a sputtering method on the lower substrate 342. In this connection, the transparent conductive film 470 is made of a transparent conductive material such as indium-tin-oxide (ITO), tin-oxide (TO), indium-tin-zinc-oxide (ITO) or indium-zinc-oxide (IZO). The gate metal film 472 is made of a metal such as an aluminum system metal including aluminum/neodymium (AlNd), molybdenum (Mo), copper (Cu), chrome (Cr), tantalum (Ta) or titanium (Ti). Subsequently, a resist pattern is formed on the lower substrate 342 provided with the transparent conductive film 470 and the gate metal layer 472 by using a printing plate in which a resist is printed in a shape of a gate pattern and a printing roller. Thereafter, the transparent conductive film 470 and the gate metal film 472 are patterned by an etching process using the resist pattern as a mask, to thereby form the data pad 336, the pixel electrode 318, and the gate pad 328 including the gate line 302, the gate electrode 308 and the gate link 452, all of which have the double-layer structure.

Figure 17A:
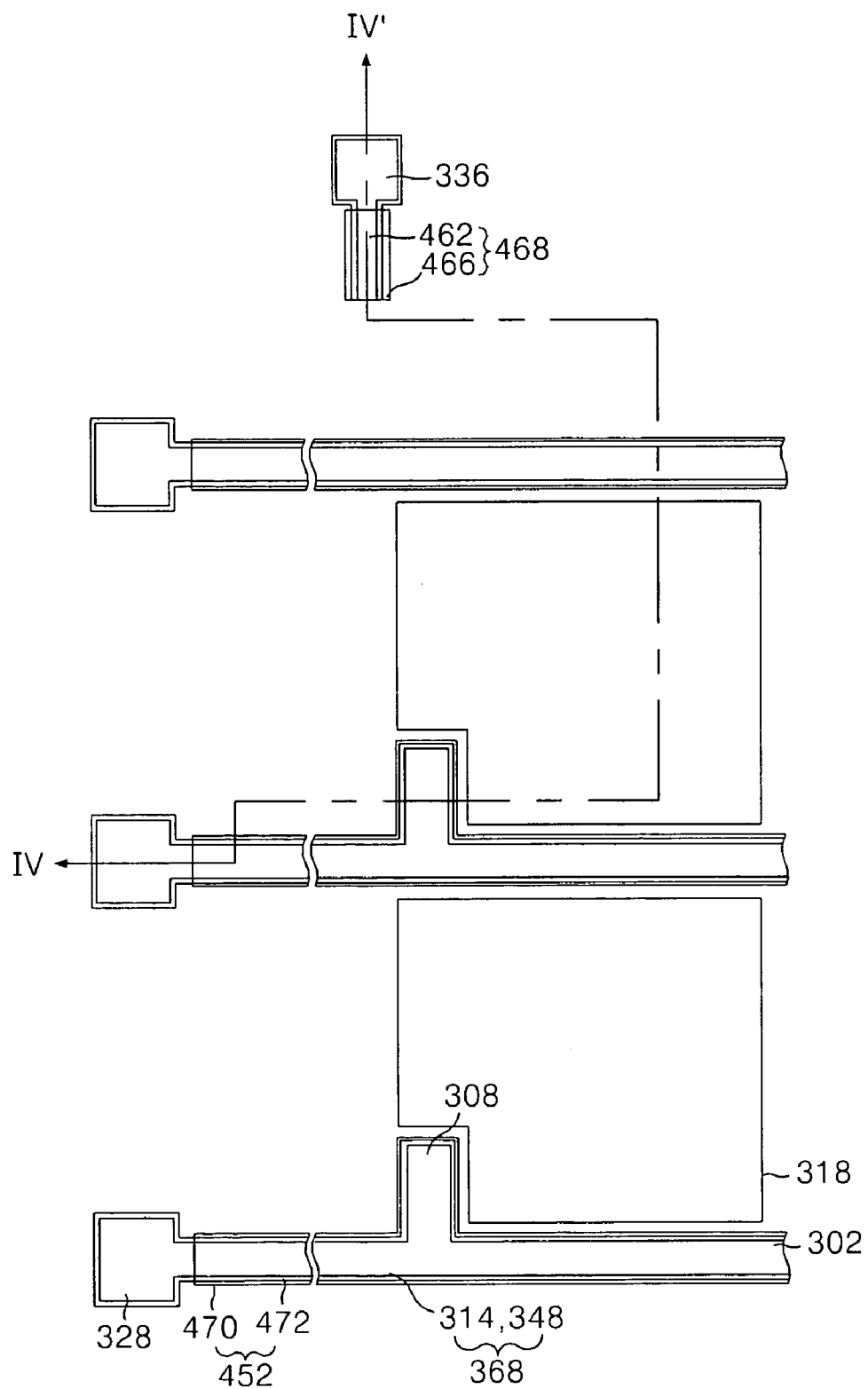
Figure 17B:
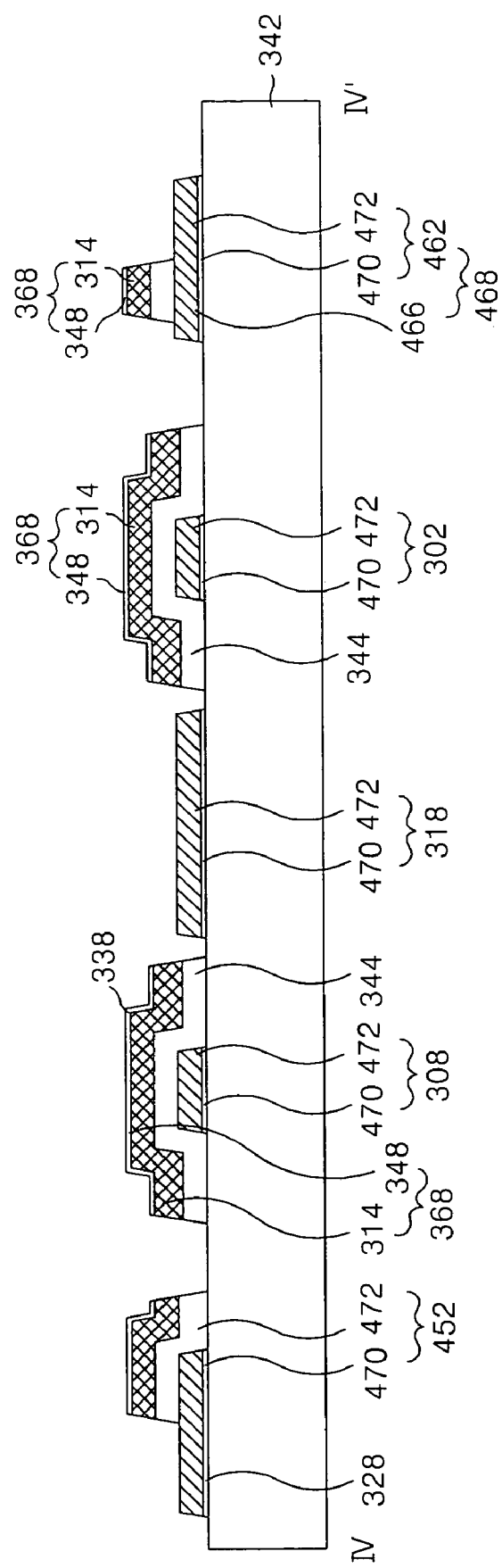

FIGS. 17A and 17B are configurations illustrating a formation of the semiconductor pattern 368 including the gate insulating pattern 344, the active layer 314 and the ohmic contact layer 348 formed on the lower substrate provided with the gate pattern in the method of fabricating the thin film transistor array substrate according to the third embodiment of the present invention.

More specifically, a gate insulating film, a first semiconductor layer and a second semiconductor layer are sequentially formed by a deposition method such as a sputtering method on the lower substrate 342 provided with the gate pattern. Herein, the gate insulating film is made of an inorganic insulating material such as silicon oxide ($SiO_x$) or silicon nitride ($SiN_x$), the first semiconductor layer is made of an amorphous silicon that is not doped with an impurity while the second semiconductor layer is formed of amorphous silicon doped with an N-type or P-type impurity. Subsequently, a resist pattern is formed on the lower substrate 342 provided with the first semiconductor layer and the second semiconductor layer by using a printing plate in which a resist is printed in a shape of a semiconductor pattern and a printing roller. Thereafter, the first semiconductor layer and the second semiconductor layer are patterned by an etching process using the resist pattern as a mask, to thereby form the gate insulating pattern 344 and the semiconductor pattern 368, wherein the gate insulating pattern 344 overlaps the gate line 302, the gate electrode 308, the gate link 452 and the data link 462 and wherein the semiconductor pattern 368 includes the active layer 314 and the ohmic contact layer 348 which have a width wider than that of the gate pattern on the gate insulating pattern 344. This is for preventing deterioration of a channel characteristic to be generated when the semiconductor pattern 368 has a width narrower than that of the gate electrode 308.

Figure 18A:
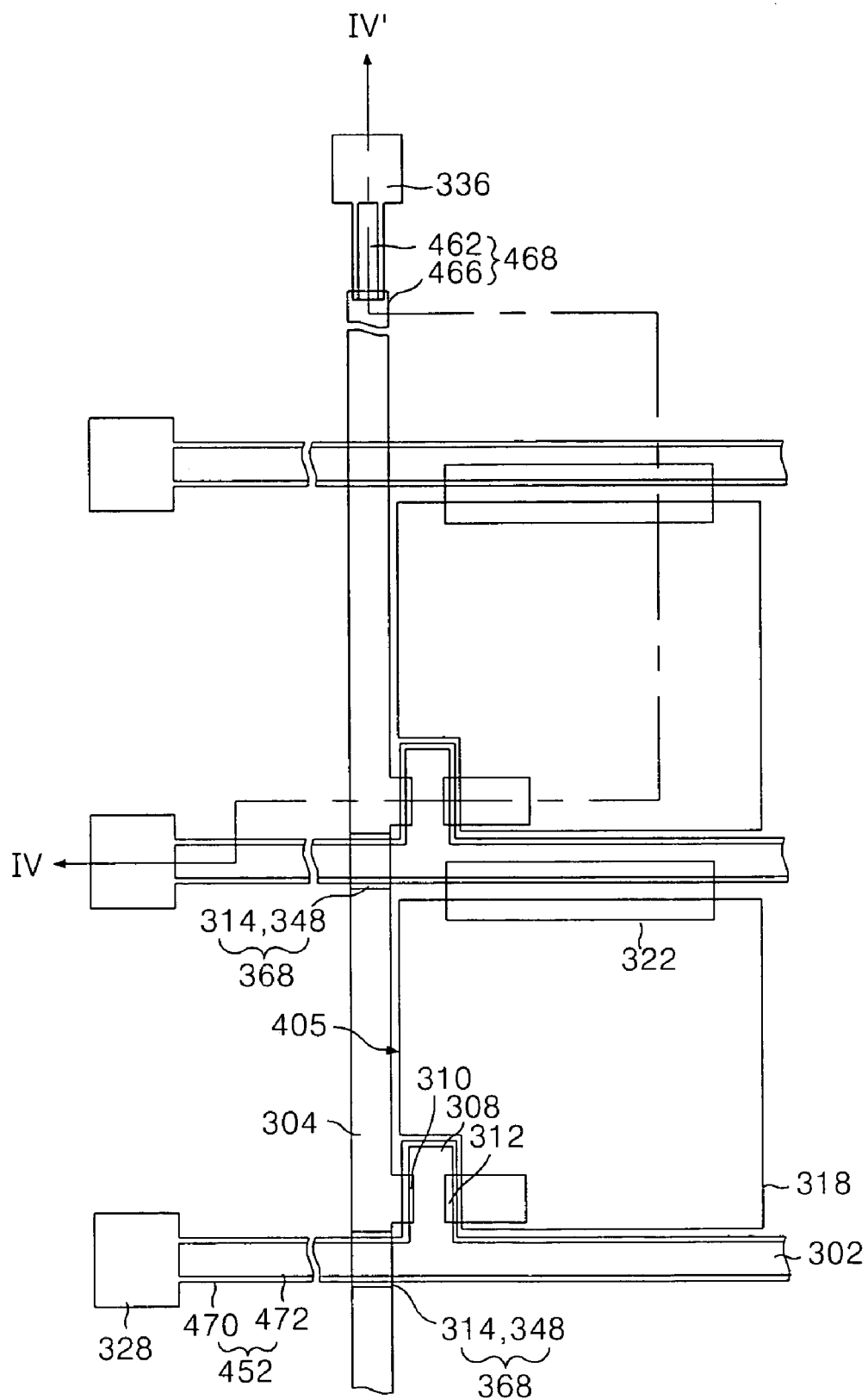
Figure 18B:
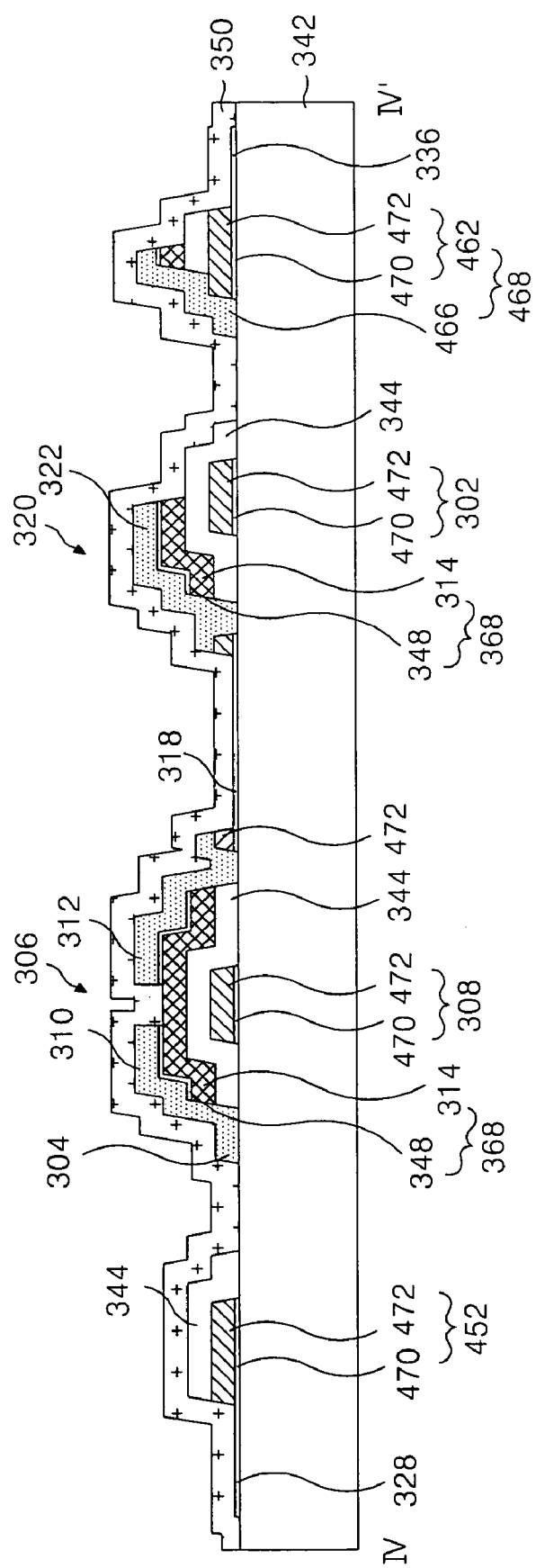

FIGS. 18A and 18B are configurations illustrating a formation of the source/drain pattern including the data line 304, the source electrode 310, the drain electrode 312 and the upper data link electrode 466 formed on the lower substrate 352 provided with the gate insulating pattern and the semiconductor pattern 368, and illustrating an exposure of the transparent conductive film 470 made by removing the gate metal layer included in the data pad 336, the gate pad 328 and the pixel electrode 318 in the method of fabricating the thin film transistor array; substrate according to the third embodiment of the present invention.

Hereinafter, a process for the formation of the source/drain pattern and the exposure of the transparent conductive film 470 will be described in detail with reference to FIGS. 19A to 19E.

First of all, a source/drain metal 304a is formed on the lower substrate having the semiconductor pattern 368 thereon by a deposition method such as a sputtering method. Herein, the source/drain metal layer 304a is made of a metal such as molybdenum (Mo), copper (Cu) or the like.

Figure 19A:
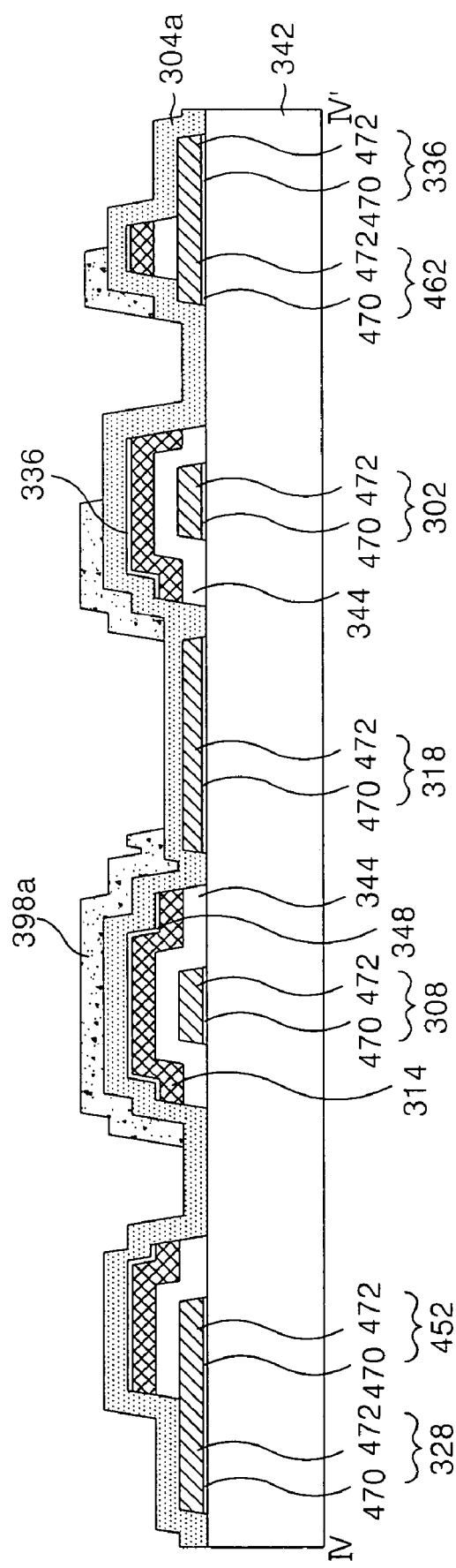

Thereafter, a first printing plate (not shown) in which a first resist is printed in a groove with a shape of a source/drain pattern including the source electrode 310, the drain electrode 312 being integral to the source electrode 310, the storage electrode 322, the data line 304 and the upper data link electrode 466 is prepared. A printing roller is contacted with the first printing plate and, at the same time, is rotated, thereby adhering the first resist to the printing roller. The printing roller having the first resist is contacted with the lower substrate 342 provided with the source/drain metal layer 304a and, as the same time, is rotated, thereby forming a first resist pattern 398a on the lower substrate 342 provided with the source/drain metal layer 304a, as shown in FIG. 19A. Subsequently, a second printing plate in which a second resist is printed in a groove with a shape of the source/drain pattern including the source electrode 310, the drain electrode 312 separated from the source electrode 310, the storage electrode 322, the data line 304 and the upper data link electrode 466 is prepared. Thereafter, the second resist is adhered on the printing roller. Next; the printing roller having the second resist is contacted with the lower substrate provided with the first resist pattern 398a and, at the same time, is rotated, thereby forming a second resist pattern 398b on the lower substrate 342 provided with the first resist pattern 398a. Hereby, the resist pattern of the channel portion of the thin film transistor has a lower height than a resist pattern of the source/drain pattern part.

Figure 19B:
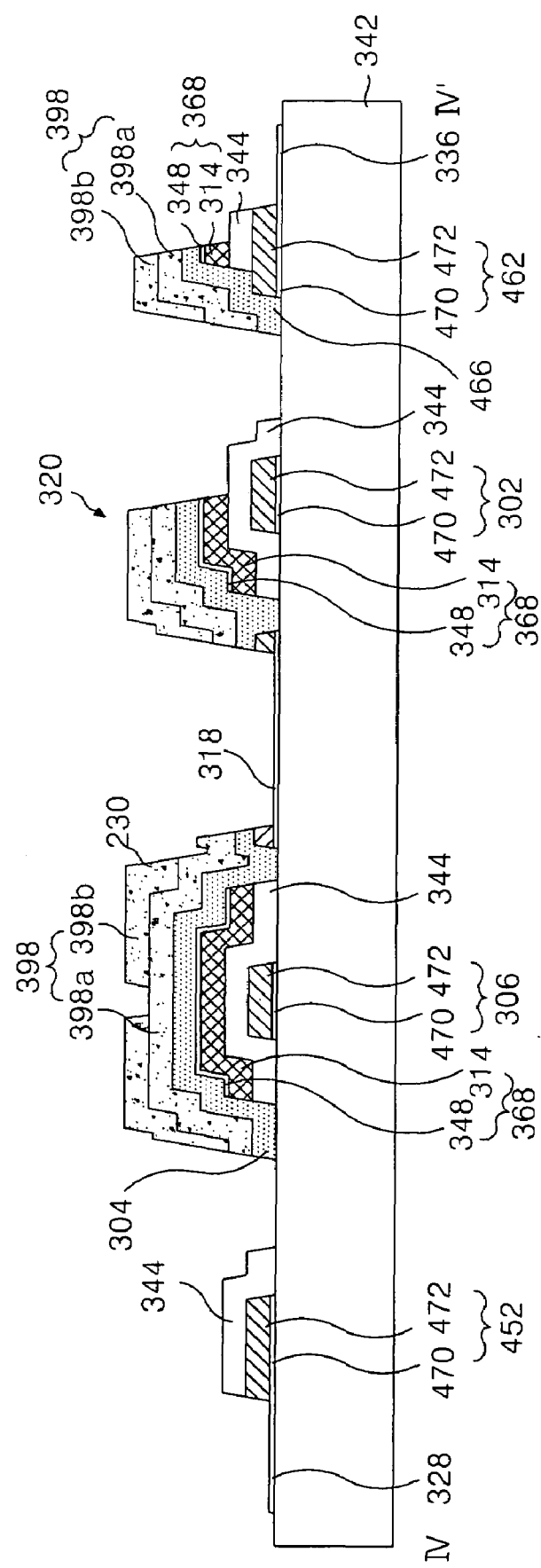

Subsequently, the source/drain metal layer 304a is patterned by a wet etching process using the resist pattern 398 as a mask, to thereby provide the source/drain pattern including the storage electrode 322, the data line 304, the source electrode 310 connected to the data line 304, the drain electrode 312 and the upper data link electrode 366 connected to one side different from the data line 304. The gate metal film 472 formed beneath the source/drain pattern is removed using the gate insulating pattern 344 as a mask to thereby expose the transparent conductive film 470 including the data pad 336, the gate pad 328 and the pixel electrode 318, as shown in FIG. 19B. At this time, the gate insulating film 472 remains at an area where the pixel electrode 318 is overlapped with the drain electrode 312 and the storage electrode 322.

Also, the active layer 314 and the ohmic contact layer 348 are formed along the source/drain pattern by a dry-etching process using the resist pattern 398 as a mask. At this time, aside from the active layer 314 and the ohmic contact layer 348 overlapped with the source/drain pattern, the active layer 314 and the ohmic contact layer 348 which are formed at the other areas are removed. This is for preventing a short between cells by the semiconductor pattern 368 including the active layer 314 and the ohmic contact layer 348.

Figure 19C:
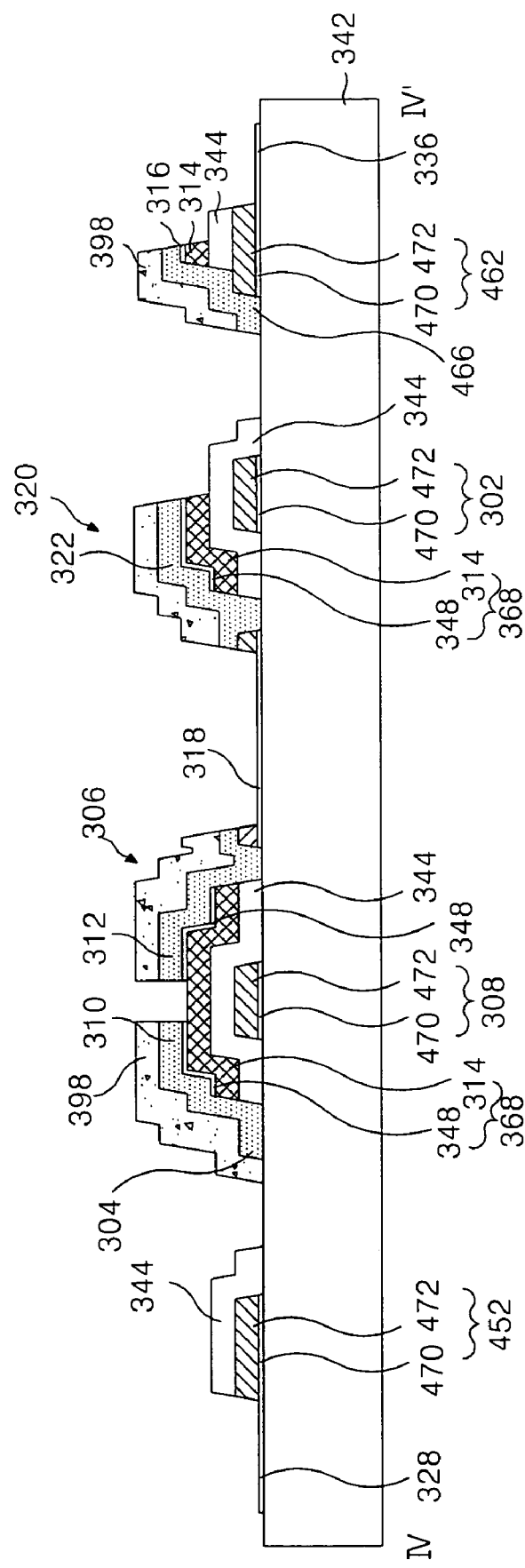
Figure 19D:
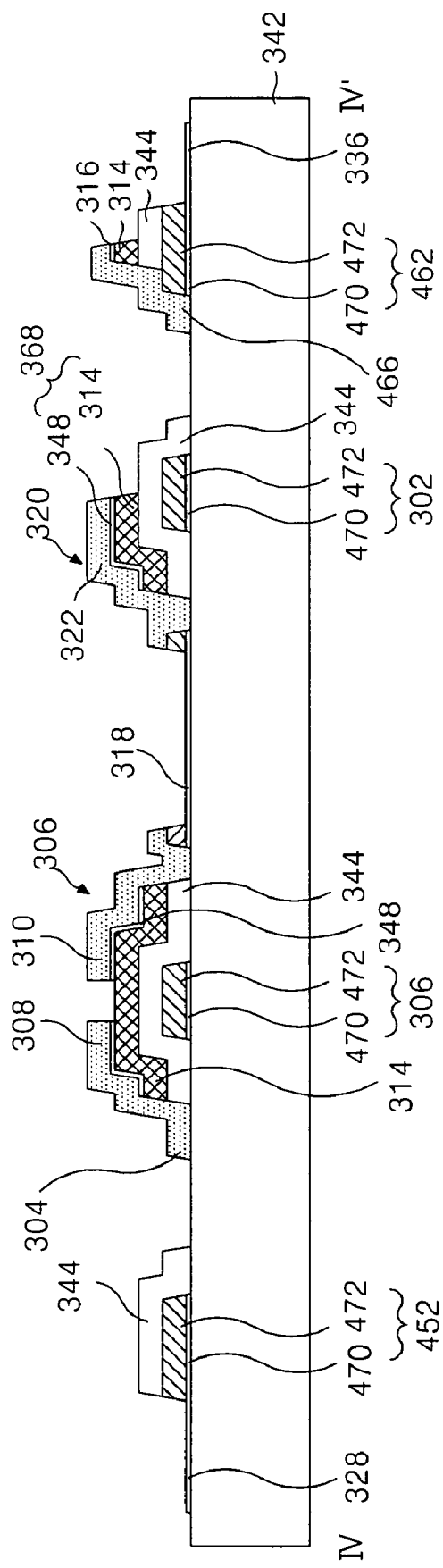

Subsequently, as shown in FIG. 19C, the resist pattern 398 having a relatively low height in the channel portion is removed by an ashing process, and thereafter the source/drain pattern and the ohmic contact layer 348 of the channel portion are etched by a dry etching process. Thereafter, a remainder of the resist pattern 398 left on the source/drain pattern part is removed using a stripping process as shown in FIG. 19D.

Figure 19E:
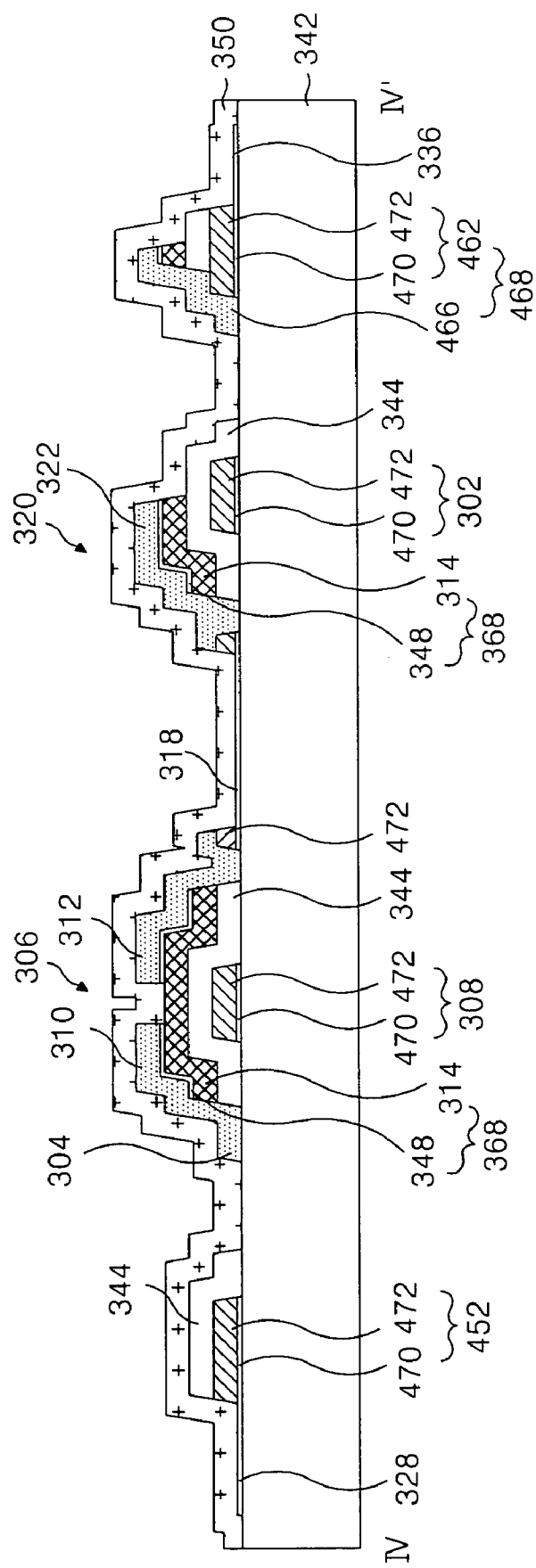

Subsequently, a passivation film 350 is entirely formed on the substrate 342 provided with the source/drain pattern, as shown in FIG. 19E. The passivation film 350 is made of an inorganic insulating material such as a material of the gate insulating film 144 or an organic insulating material having a small dielectric constant such as an acrylic organic compound, BCB (benzocyclobutene) or PFCB (perfluorocyclobutane).

The thin film transistor array substrate is combined with a color filter array substrate (not shown) having a black matrix, the color filer and the like by a sealant. Thereafter, a passivation film of the thin film transistor array substrate is patterned by a pad open process using the color filter array substrate as a mask, to thereby form a passivation pattern at a display area and to expose the transparent conductive film 470 included in at least one of the gate pad 328, the data pad 336 and a common pad of a pad area.

According to the third embodiment of the method of fabricating the thin film transistor array substrate, the pixel electrode and the gate pattern are formed by the first printing plate and the printing roller, the semiconductor pattern is formed through the use of the second printing plate and the printing roller, the data pattern is formed through the use of the third and the fourth printing plates and the printing roller, and the transparent conductive film included in the pixel electrode, the gate pad and the data pad is exposed. Accordingly, the thin film transistor array substrate is completed. Hereby, the number of etching processes and stripping processes are reduced as compared with the related art. As a result, the fabricating process is simplified and the material cost reduced.

As described above, the liquid crystal display panel according to one embodiment of the present invention forms the stepped resist pattern by using the first and the second printing plates and the printing roller, and forms the designated array layers by using the resist pattern. Hereby, at least one or more of the etching processes and stripping processes is reduced. Accordingly, it is possible to simplify the fabricating process and thus reduce the material cost.

Although the present invention has been explained by the embodiments shown in the drawings described above, it should be understood to the ordinary skilled person in the art that the invention is not limited to the embodiments, but rather that various changes or modifications thereof are possible without departing from the spirit of the invention. Accordingly, the scope of the invention shall be determined only by the appended claims and their equivalents.

What is claimed is:

1. A method of fabricating a liquid crystal display panel, the method comprising:
    forming a first conductive layer on a substrate;
    printing a first resist pattern on the first conductive layer;
    patterning the first conductive layer using the first resist pattern to form a gate pattern including a gate line and a gate electrode;
    forming a gate insulating film on the gate pattern;
    sequentially stacking a semiconductor layer and a second conductive layer on the gate insulating film;
    printing a second resist pattern having a stepped part on the second conductive layer;
    patterning the semiconductor layer and the second conductive layer using the second resist pattern having the stepped part to form a source/drain pattern including a semiconductor pattern, a data line, a source electrode of a thin film transistor and a drain electrode of the thin film transistor;
    forming a passivation film on the substrate having the source/drain pattern;
    printing a third resist pattern on the passivation film;
    patterning the passivation film using the third resist pattern;
    forming a third conductive layer on the patterned passivation film and the third resist pattern; and
    removing the third resist pattern to form a transparent electrode pattern including a pixel electrode connected to the drain electrode of the thin film transistor,
    wherein printing the second resist pattern includes:
    adhering a fourth resist pattern to a first roller by contacting a first printing plate with the first roller, the first printing plate having the fourth resist pattern printed thereon;
    forming the fourth resist pattern on the second conductive layer by contacting the first roller having the fourth resist pattern adhered thereto onto the second conductive layer;
    adhering a fifth resist pattern to a second roller by contacting a second printing plate with the second roller, the second printing plate having the fifth resist pattern printed thereon; and
    forming the fifth resist pattern on the fourth resist pattern by contacting the second roller having the fifth resist pattern adhered thereto onto the fourth resist pattern.

2. The method according to claim 1, wherein the fourth resist pattern is formed with a pattern identical to the source/drain pattern.

3. The method according to claim 1, wherein the fifth resist pattern is formed with a pattern identical to the source/drain pattern except without a portion of the source/drain pattern formed on an area overlapped with a channel area of the semiconductor pattern.

4. A method of fabricating a liquid crystal display panel, the method comprising:
    forming a first conductive layer on a substrate;
    printing a first resist pattern on the first conductive layer;
    patterning the first conductive layer using the first resist pattern to form a gate pattern including a gate line and a gate electrode;
    forming a gate insulating film on the gate pattern;
    sequentially stacking a semiconductor layer and a second conductive layer on the gate insulating film;
    printing a second resist pattern having a stepped part on the second conductive layer, wherein the printing step comprises adhering the second resist pattern to a second roller by contacting a second printing plate with the second, the second printing plate having, the second resist pattern printed thereon, and forming the second resist pattern on the second conductive layer by contacting the second roller having the second resist pattern adhered thereto onto the second conductive layer;
    patterning the semiconductor layer and the second conductive layer using the second resist pattern having the stepped part to form a source/drain pattern including a semiconductor pattern, a data line, a source electrode of a thin film transistor and a drain electrode of the thin film transistor;
    forming a passivation film on the substrate having the source/drain pattern;
    printing a third resist pattern on the passivation film;
    patterning the passivation film using the third resist pattern;
    forming a third conductive layer on the patterned passivation film and the third resist pattern; and
    removing the third resist pattern to form a transparent electrode pattern including a pixel electrode connected to the drain electrode of the thin film transistor.

* * * * *

UNITED STATES PATENT AND TRADEMARK OFFICE
CERTIFICATE OF CORRECTION

PATENT NO. : 7,300,830 B2  
APPLICATION NO. : 10/963856  
DATED : November 27, 2007  
INVENTOR(S) : Soon Sung Yoo et al.

It is certified that error appears in the above-identified patent and that said Letters Patent is hereby corrected as shown below:

On the Title Page

Item 57, line 12, ABSTRACT, delete "and the third resist pattern" (second occurrence).

Column 17 in claim 1, line 4, immediately after "conductive layer" delete "," (comma) and substitute --;-- (semicolon) in its place.

Column 18, in claim 4, line 15, immediately after "plate having" delete "," (comma).

Signed and Sealed this

Twenty-seventh Day of May, 2008

JON W. DUDAS  
*Director of the United States Patent and Trademark Office*